United States Patent
Sugitani et al.

[11] Patent Number: 5,998,233
[45] Date of Patent: Dec. 7, 1999

[54] MANUFACTURE PROCESS OF QUARTZ VIBRATOR

[75] Inventors: Nobuyoshi Sugitani, Toyota; Motohiro Fujiyoshi, Aichi-gun; Motoyasu Hanji, Itabashi-ku, all of Japan

[73] Assignee: Toyota JidoshaKabushiki Kaisha/Kinseki Limited, Tokyo, Japan

[21] Appl. No.: 08/885,165

[22] Filed: Jun. 30, 1997

[30] Foreign Application Priority Data

Jul. 26, 1996 [JP] Japan .................................. 8-197813

[51] Int. Cl.[6] .................................................. H01L 21/00
[52] U.S. Cl. ............................ 438/52; 438/53; 73/514.01
[58] Field of Search ................................... 216/2, 80, 97, 216/40, 41; 438/733, 52, 53

[56] References Cited

U.S. PATENT DOCUMENTS 4,969,359  11/1990  Mikkor ...................................... 73/517

FOREIGN PATENT DOCUMENTS 5308238A  11/1993  Japan .

*Primary Examiner*—Bruce Breneman
*Assistant Examiner*—Alva C. Powell
*Attorney, Agent, or Firm*—Kenyon & Kenyon

[57] ABSTRACT

Since etching of a crotch portion of quartz vibrator defined by segment 18, first segment 13, and second segment 17 advances in accordance with the crystal orientations of quartz, the shape of side surfaces of two quartz vibrating bars opposite to each other with this crotch portion in between can be made symmetric, whereby stress applied on the two quartz vibrating bars can be equalized.

9 Claims, 12 Drawing Sheets

MANUFACTURE PROCESS OF QUARTZ VIBRATOR

BACKGROUND OF THE INVENTION

1. Field of the Invention

The present invention relates to a process for manufacturing a quartz vibrator for vibrating with application of voltage thereto. The present quartz vibrator can be applied to angular velocity detecting apparatus or measurement techniques utilizing its vibration.

2. Related Background Art

A conventional quartz vibrator is described in the bulletin of Japanese Laid-open Patent Application No. 5-308238.

SUMMARY OF THE INVENTION

According to the above bulletin, a crotch portion between a pair of quartz vibrating bars extending in parallel is made by etching with a U-shaped mask formed thereon.

However, because the crystal orientations of quartz are different from the U-shape, the etching with the U-shaped mask as described above results in leaving an essentially asymmetric shape of etch residue with respect to the quartz vibrating bars, so that the etch residue exists at the crotch portion between the quartz vibrating bars. When such asymmetric quartz vibrating bars are made to vibrate along the X-axis of quartz, the quartz vibrating bars also vibrate in the directions along the Z-axis because of the asymmetry. Therefore, it cannot be said that vibration stability is sufficient of the quartz vibrator using such asymmetric quartz vibrating bars.

The present invention has been accomplished based on this problem and provides a process for manufacturing a quartz vibrator capable of vibrating more stably than in the above prior art.

The present invention relates to a manufacture process of quartz vibrator. This process is achieved in consideration of the crystal orientations of quartz and is arranged to form the mask so as to match the crystal orientations of quartz. Quartz has three X-axes, wherein adjacent X-axes intersect with each other at an angle of 120°.

The present process is directed to a process for manufacturing a quartz vibrator which has a base of quartz and first and second quartz vibrating bars extending in a same direction from the base and being capable of vibrating with application of voltage thereto. This process comprises a step of preparing a quartz wafer which has a principal surface perpendicular to an axis extending along the Z-axis of quartz, a step of forming on the principal surface a mask which has a base-correspondent region and first and second vibrating-bar-correspondent regions extending in a same direction along an axis perpendicular to a predetermined X-axis of the quartz wafer from the base-correspondent region, and a step of etching the quartz wafer with the mask formed thereon, thereby forming the base and the first and second quartz vibrating bars immediately below the base-correspondent region and below the first and second vibrating-bar-correspondent regions, respectively, of the mask.

Here, a perimeter of the base-correspondent region has a predetermined portion located between the first and second vibrating-bar-correspondent regions and extending along the X-axis, a perimeter of the first vibrating-bar-correspondent region has a first segment continuing at one end thereof to one end of the predetermined portion of the base-correspondent region and extending in a direction to approach a tip end of the first vibrating-bar-correspondent region as making an angle of about 30° with the X-axis, and a perimeter of the second vibrating-bar-correspondent region has a second segment continuing at one end thereof to the other end of the predetermined portion of the base-correspondent region and extending in a direction to approach a tip end of the second vibrating-bar-correspondent region as making an angle of about 30° with the X-axis. The first segment of the first vibrating-bar-correspondent region of the mask makes the angle of about 30° with respect to the predetermined direction of the X-axis and extends in the direction to approach the tip end of the first vibrating-bar-correspondent region from one end of the connecting line. Here, "about 30°" is preferably an angle in the range of from 24° to 36°. As described above, quartz has another X-axis intersecting at an angle of 120° with respect to the predetermined direction of the X-axis. Therefore, the first segment makes an angle of about 90° with the another X-axis.

The second segment of the second vibrating-bar-correspondent region of the mask makes the angle of about 30° with this X-axis and extends in the direction to approach the tip end of the second vibrating-bar-correspondent region. Namely, the second segment makes an angle of about 150° with respect to the above predetermined direction of the X-axis. As described above, quartz has the other X-axis intersecting at an angle of −120° with respect to the predetermined direction of the X-axis. Therefore, the second segment makes an angle of about 90° with the other X-axis.

Since the first and second segments intersect at the angle of about 90° with the above another X-axis and with the other X-axis, respectively, etching of the quartz wafer advances from the principal surface of quartz wafer into the inside thereof along the direction perpendicular to these X-axes with the first segment and second segment of mask being borders.

By etching of the quartz wafer with the mask having the first vibrating-bar-correspondent region including the first segment, the first quartz vibrating bar can be formed immediately below this region. Also, by etching of the quartz wafer with the mask having the second vibrating-bar-correspondent region including the second segment, the second quartz vibrating bar can be formed immediately below this region.

Upon vibration of the quartz vibrating bars, stress concentrates on the crotch portion of quartz vibrator comprised of the predetermined portion of the base-correspondent region and the first and second segments. Since in the present process etching of the crotch portion of quartz vibrator advances in accordance with the crystal orientations of quartz defined by these segments, the shape of etch residue on the side surfaces of the two quartz vibrating bars opposite to each other with this crotch portion in between can be made symmetric when compared with that made by the above conventional process, whereby the stress applied on the two quartz vibrating bars can be equalized.

Further, the present applicant made the above crotch portion by etching the quartz wafer with the aforementioned U-shaped mask, which showed that this crotch portion was defined by a segment intersecting at an angle of 27.360° (about 30°) with the X-axis and extending toward the tip end of the first vibrating-bar-correspondent region, a segment intersecting at an angle of 37.439° (about 40°) with the X-axis and extending toward the tip end of the second vibrating-bar-correspondent region, and a segment intersecting at an angle of 84.395° (about 85°) with the X-axis and extending toward the tip end of the second vibrating-bar-correspondent region. Therefore, symmetry of this crotch portion can be enhanced more, if the crotch portion between the opposite quartz vibrating bars is made with a mask having segments along these segments based on the experimental data.

Specifically, a preferred arrangement is such that the perimeter of the above first vibrating-bar-correspondent region has a third segment continuing at one end thereof to the other end of the first segment and extending in a direction to approach the tip end of the first vibrating-bar-correspondent region as making an angle of about 40° with the X-axis, and a fourth segment continuing at one end thereof to the other end of the third segment and extending in a direction to approach the tip end of the first vibrating-bar-correspondent region as making an angle of about 85° with the X-axis and that the perimeter of the above second vibrating-bar-correspondent region has a fifth segment continuing at one end to the other end of the second segment and extending in a direction to approach the tip end of the second vibrating-bar-correspondent region as making an angle of about 40° with the X-axis, and a sixth segment continuing at one end thereof to the other end of the fifth segment and extending in a direction to approach the tip end of the second vibrating-bar-correspondent region as making an angle of about 85° with the X-axis. Here, "about 40°" is preferably an angle in the range of from 34.5° to 40.5° and "about 85°" is preferably an angle in the range of from 78.5° to 90.5°.

Since in the present process the etching of the crotch portion of quartz vibrator also advances in accordance with the crystal orientations of quartz defined by these segments, the shape of etch residue on the side surfaces of the two quartz vibrating bars opposite to each other with this crotch portion in between can be made symmetric as compared with that made by the above conventional process.

Further, in place of the segments at the above respective angles of 37.439° and 84.395°, the above crotch portion of quartz wafer may be etched with a mask having approximate segments at an angle being an intermediate value of 60.917° (about 60°) between these angles.

According to this process, preferably, the perimeter of the above first vibrating-bar-correspondent region has a segment continuing at one end thereof to the other end of the first segment and extending in a direction to approach the tip end of the first vibrating-bar-correspondent region as making an angle of about 60° with the X-axis and the perimeter of the above second vibrating-bar-correspondent region has a segment continuing at one end thereof to the other end of the second segment and extending in a direction to approach the tip end of the second vibrating-bar-correspondent region as making an angle of about 60° with the X-axis. Here, "about 60°" is preferably an angle in the range of from 54° to 66°.

The above manufacture process of quartz vibrator was achieved in consideration of symmetry of the paired quartz vibrating bars, but this may be achieved in consideration of symmetry of a single quartz vibrating bar.

Specifically, the present process is directed to a process for manufacturing a quartz vibrator which has a base of quartz and a quartz vibrating bar extending from the base and being capable of vibrating with application of voltage thereto. The present quartz vibrator may have another quartz vibrating bar in addition to the above quartz vibrating bar.

This process comprises a step of preparing a quartz wafer which has a principal surface perpendicular to an axis extending along the Z-axis of quartz, a step of forming on the principal surface a mask which has a base-correspondent region and a vibrating-bar-correspondent region extending along an axis perpendicular to a predetermined X-axis of the quartz wafer from the base-correspondent region, and a step of etching the quartz wafer with the mask formed thereon, thereby forming the base and the quartz vibrating bar immediately below the base-correspondent region and below the vibrating-bar-correspondent region, respectively, of the mask, wherein a perimeter of the vibrating-bar-correspondent region has a first segment continuing at one end thereof to the base-correspondent region and extending in a direction to approach a tip end of the vibrating-bar-correspondent region as making an angle of about 30° with the X-axis, and a second segment continuing at one end thereof to the base-correspondent region as being spaced a predetermined distance from the first segment and extending in a direction to approach the tip end of the vibrating-bar-correspondent region as making an angle of about 30° with the X-axis.

By etching of the quartz wafer with the mask having this vibrating-bar-correspondent region, the quartz vibrating bar can be made immediately below this region. Here, during vibration of the quartz vibrating bar stress concentrates on the root portion of the quartz vibrating bar comprised of the first and second segments. Since in the present process etching of the root portion of quartz vibrating bar advances in accordance with the crystal orientations of quartz defined by these segments, the shape of etch residue on the side surfaces of the quartz vibrating bar defined by this root portion can be made symmetric as compared with that made by the above conventional process, whereby the stress applied on the quartz vibrating bar can be equalized.

From the aforementioned experimental result, a preferred arrangement is such that the perimeter of the above vibrating-bar-correspondent region has a third segment continuing at one end thereof to the other end of the first segment and extending in a direction to approach the tip end of the vibrating-bar-correspondent region as making an angle of about 40° with the X-axis, a fourth segment continuing at one end thereof to the other end of the third segment and extending in a direction to approach the tip end of the vibrating-bar-correspondent region as making an angle of about 85° with the X-axis, a fifth segment continuing at one end thereof to the other end of the second segment and extending in a direction to approach the tip end of the vibrating-bar-correspondent region as making an angle of about 40° with the X-axis, and a sixth segment continuing at one end thereof to the other end of the fifth segment and extending in a direction to approach the tip end of the vibrating-bar-correspondent region as making an angle of about 85° with the X-axis.

Further, from the above experimental result, the process may be arranged so that the perimeter of the above vibrating-bar-correspondent region has a segment continuing at one end thereof to the other end of the first segment and extending in a direction to approach the tip end of the vibrating-bar-correspondent region as making an angle of about 60° with the X-axis, and a segment continuing at one end thereof to the other end of the second segment and extending in a direction to approach the tip end of the vibrating-bar-correspondent region as making an angle of about 60° with the X-axis.

The quartz vibrating bar has a projecting portion on a side surface located between the principal surface and a back surface opposite thereto and extending along the perimeter of the above vibrating-bar-correspondent region. Here, the above etching is continued preferably before a height of this projecting portion becomes 8% or less of a distance between the principal surface and the back surface.

When the quartz vibrating bar is made to vibrate in the directions along the X-axis, the quartz vibrating bar also vibrates in the directions along the Z-axis because of this projecting portion. By continuing etching of the aforementioned crotch portion or the root portion of the quartz wafer until the height of the projecting portion on the side surface of quartz vibrating bar defined by the above vibrating-bar-correspondent region becomes 8% or less of the distance between the principal surface and the back surface, i.e., the thickness of the quartz vibrating bar, leak vibration in the Z-axis directions of the quartz vibrating bar can be suppressed sufficiently. Since vibration can be stabilized sufficiently by etching the quartz wafer for the time when this value becomes 8% or less, the quartz vibrator capable of vibrating stably can be manufactured in this necessary and minimum etch time.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

A form of the manufacture process of quartz vibrator according to the present invention will be described with reference to the accompanying drawings. In the following description, the same elements will be denoted by same reference symbols and redundant description will be omitted.

In the manufacture process of quartz vibrator according to the present embodiment, a quartz wafer 1 is prepared first.

Figure 1:
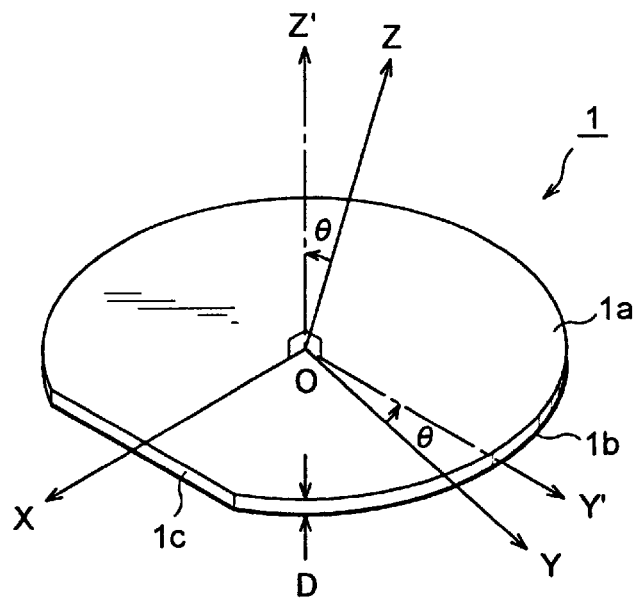
FIG. 1 is a perspective view of the quartz wafer.

FIG. 1 is a perspective view of the quartz wafer 1. The quartz wafer 1 has principal surface 1a and back surface 1b perpendicular to the principal axis Z' running within the range of angle θ with respect to the Z-axis (optic axis) of quartz. This quartz wafer 1 further has an orientation flat 1c normal to the X-axis (electrical axis) of quartz on the side surface thereof.

The distance between the principal surface 1a and the back surface 1b of quartz wafer 1, which is the thickness D of quartz wafer 1, is between 200 and 500 μm, and the angle θ is ±20°. In other words, the principal axis Z' is located at a position resulting from rotation of the Z-axis of quartz within the range of ±20° about the X-axis of quartz. The axis normal to the X-axis and Z-axis of quartz is defined as Y-axis (mechanical axis). The principal surface 1a of quartz wafer 1 is defined by the Y'-axis inclined at the angle θ with respect to the Y-axis, and the X-axis. Each set of the XYZ axes and the XY'Z' axes constitutes an orthogonal coordinate system.

Next, a metal mask is formed on each of the principal surface 1a and the back surface 1b of this quartz wafer 1.

Figure 2:
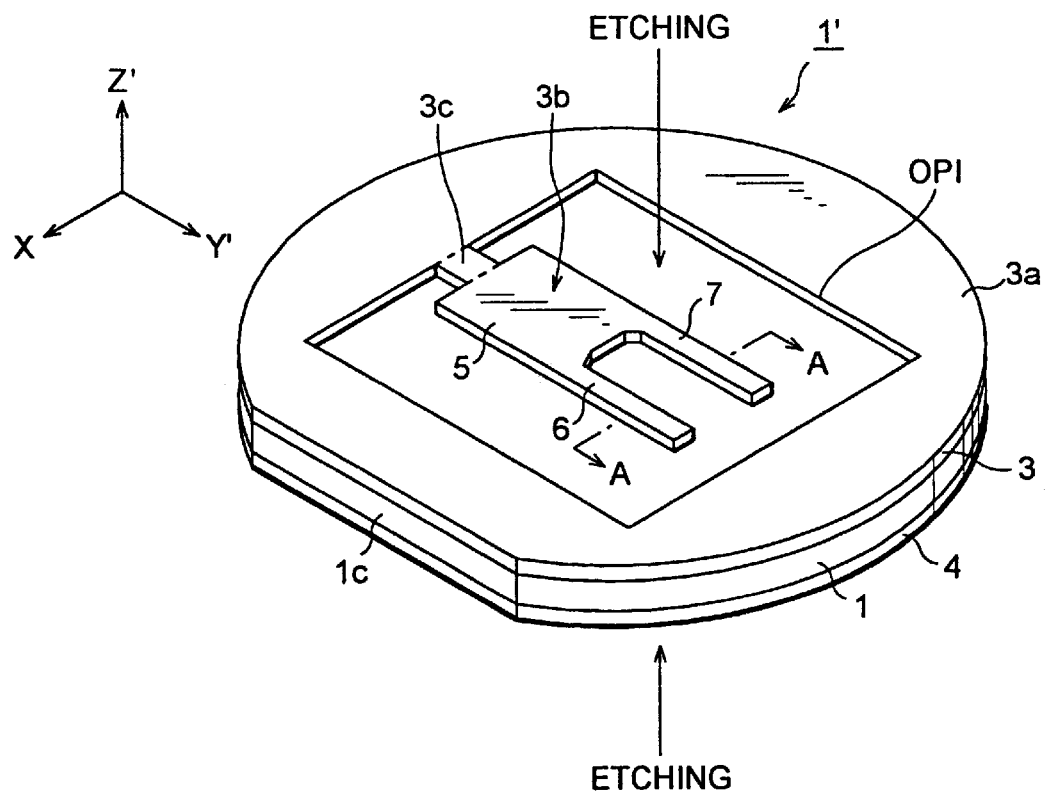
FIG. 2 is a perspective view of the quartz wafer with the mask formed thereon.
Figure 3:
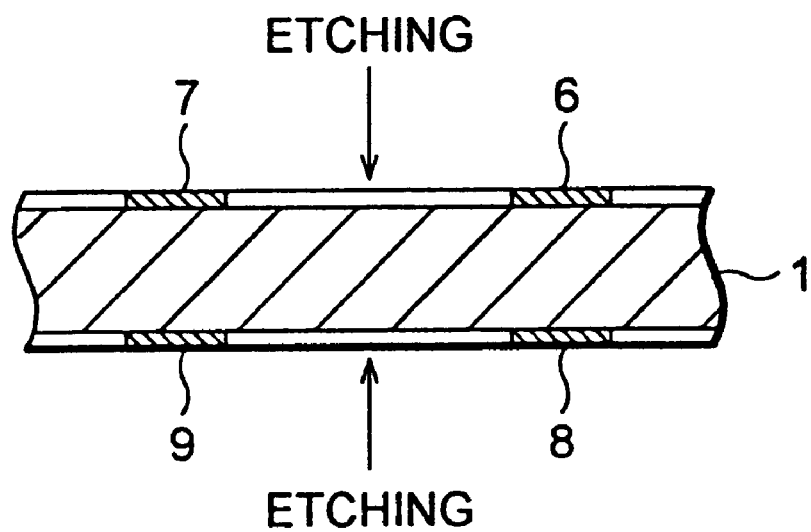
FIG. 3 is a cross-sectional view obtained by cutting the quartz wafer of FIG. 2 along line A—A and observing it along the arrows.

FIG. 2 is a perspective view of quartz vibrator intermediate 1' wherein the metal masks 3 and 4 are formed on the principal surface 1a and on the back surface 1b, respectively, of quartz wafer 1, and FIG. 3 is a cross-sectional view of the intermediate 1' obtained by cutting the intermediate 1' of FIG. 2 along line A—A and observing it along the arrows.

The metal mask 3 has a support region 3a having a rectangular opening OP1, a vibrator-correspondent region 3b formed in the opening OP1, and a connecting region 3c connecting the support region 3a with the vibrator-correspondent region 3b and the metal mask 4 has the same structure as the metal mask 3 does. For forming these metal masks 3 and 4, first, a metal layer and a photoresist are successively stacked on the principal surface 1a and on the back surface 1b of quartz wafer 1, and thereafter an exposure pattern of the same shape as that of metal masks 3 and 4 is projected onto the photoresist to expose the photoresist thereto. The exposed photoresist is partially removed with an organic solvent, thereby exposing the metal layer below the photoresist thus removed. The exposed part of the metal layer is removed with an etchant and then the all remaining photoresist is removed with another organic solvent, thereby forming the metal masks 3 and 4 shown in FIG. 2. Each of the metal masks 3 and 4 has the double-layered structure of Cr layer and Au layer (or may have a multi-layered structure of three or more layers).

Next, as shown in FIG. 2 and FIG. 3, the intermediate 1' with the metal masks 3 and 4 formed therein is etched with an etchant of $NH_4HF_2$ or the like from the top and bottom surfaces thereof.

Figure 4:
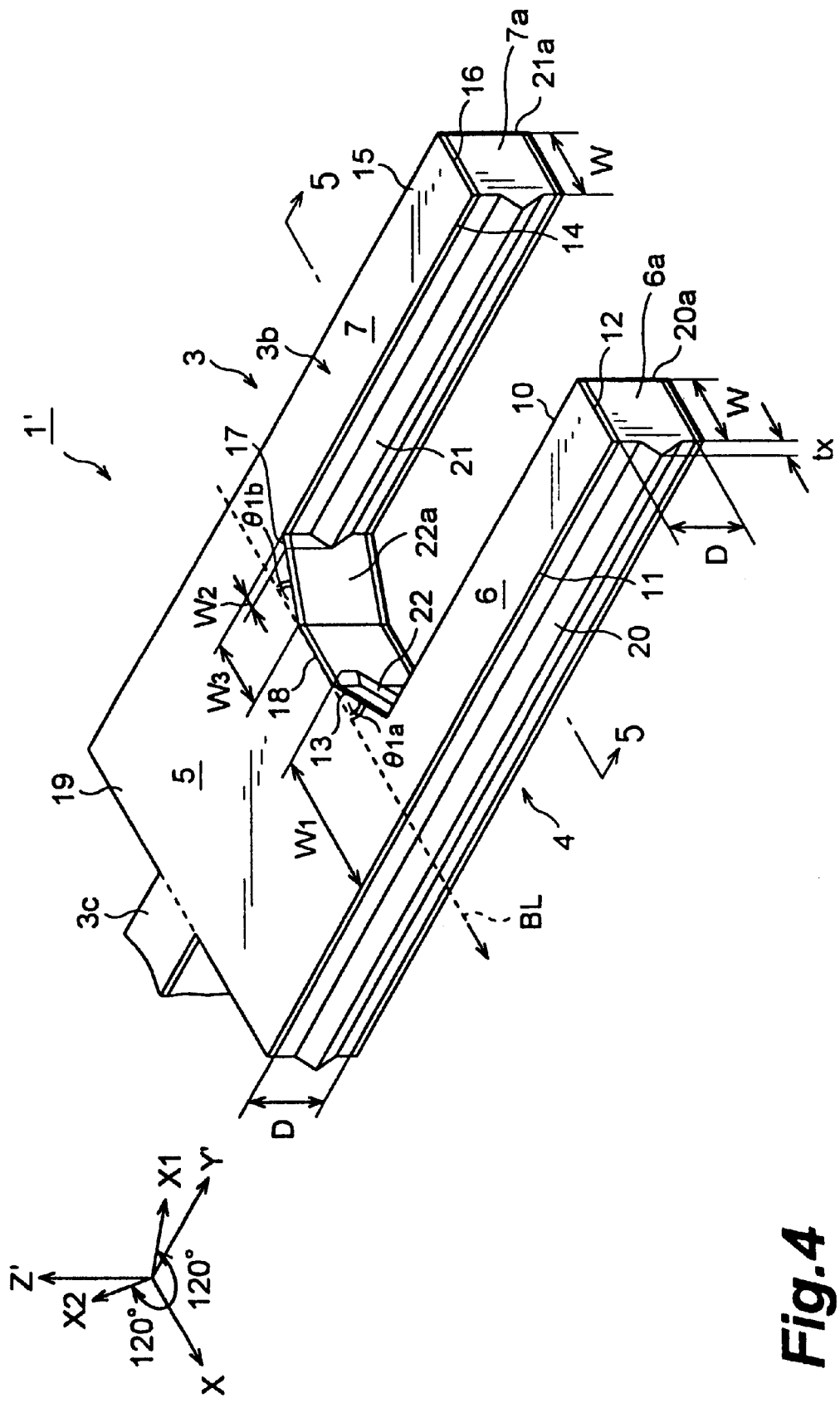
FIG. 4 is a perspective view of the quartz vibrator intermediate.
Figure 5:
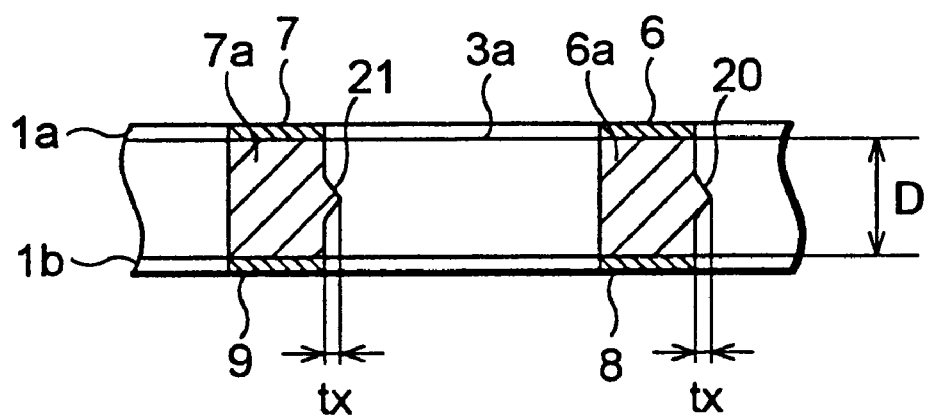
FIG. 5 is a cross-sectional view obtained by cutting the intermediate of FIG. 4 along line A—A and observing it along the arrows.

FIG. 4 is a perspective view to show the vibrator-correspondent region 3b extracted from the intermediate 1' of FIG. 2 after the above etching and FIG. 5 is a cross-sectional view of the intermediate 1' obtained by cutting the intermediate 1' of FIG. 4 along line A—A and observing it along the arrows. The region where the metal masks 3 and 4 of quartz wafer 1 are not formed is removed by the etchant and this region is through the quartz wafer 1 from the principal surface 1a to the back surface 1b. On the other hand, the region of quartz wafer 1 immediately below the masks 3 and 4 remains and the quartz vibrator is cut out of the quartz wafer 1. Next described are the pattern shape of the vibrator-correspondent region 3b of metal mask 3 used in the present embodiment and the shape of the quartz vibrator cut out of the quartz wafer 1 by this mask pattern 3.

The vibrator-correspondent region 3b of metal mask 3 is composed of base-correspondent region 5 and vibrator-bar-correspondent regions 6 and 7 and the longitudinal direction of vibrator-bar-correspondent regions 6 and 7 is parallel to the orientation flat 1c of quartz wafer 1 shown in FIG. 2.

The metal mask 4 also has vibrating-bar-correspondent regions 8 and 9 and the side edges of regions 8 and 9 are aligned with the corresponding side edges of regions 6 and 7 along the Z'-axis. Namely, the metal mask 4 is a resultant from translational movement of the metal mask 3 along the Z'-axis. Therefore, the structure of metal mask 4 is the same as that of metal mask 3, and the description of the structure of metal mask 4 is thus omitted.

The vibrating-bar-correspondent regions 6 and 7 of metal mask 3 extend in parallel with each other along the positive direction of the Y'-axis from one end of the base-correspondent region 5.

The vibrating-bar-correspondent region 6 is surrounded by segment 10 and segment 11 parallel to the Y'-axis, segment 12 being parallel to the X-axis and connecting one end of segment 10 with one end of segment 11, segment 13 continuing at one end thereof to the other end of segment 10 and intersecting with the X-axis within the range of angle $\theta_{1a}$, and virtual line BL passing the other end of segment 13 and being parallel to the X-axis. The virtual line BL is a border line between the vibrating-bar-correspondent region 6 and the base-correspondent region 5 and also a border line between the vibrating-bar-correspondent region 7 and the base-correspondent region 5.

The vibrating-bar-correspondent region 7 of metal mask 3 is surrounded by the virtual line BL parallel to the X-axis, segment 14 and segment 15 nearly parallel to the Y'-axis, segment 16 being parallel to the X-axis and connecting one end of segment 14 with one end of segment 15, and segment 17 continuing at one end thereof to the other end of segment 14 and intersecting with the X-axis within the range of angle $\theta_{1b}$. Here, the angles $\theta_{1a}$ and $\theta_{1b}$ each are 30±6°.

The base-correspondent region 5 of metal mask 3 has at one end a segment 18 (a predetermined portion) connecting the other ends of the segments 13 and 17 of the vibrating-bar-correspondent regions 6 and 7 making the angles $\theta_{1a}$ and $\theta_{1b}$ with the X-axis, with each other. The segment 18 is a part of the aforementioned virtual line BL parallel to the X-axis and the base-correspondent region 5 spreads away from the vibrating-bar-correspondent regions 6 and 7 with the virtual line BL being a border. Namely, the base-correspondent region 5 is surrounded by the segments 18, 19 parallel to the X-axis and the segments 11 and 15 parallel to the Y'-axis, thus forming a rectangle.

The distance between the two parallel segments 10 and 11 extending along the longitudinal direction of the vibrating-bar-correspondent region 6, i.e., the width of the vibrating-bar-correspondent region 6 is equal to the width of the vibrating-bar-correspondent region 7 which is the distance between the two parallel segments 14 and 15 extending along the longitudinal direction of the vibrating-bar-correspondent region 7 and these widths both are W. Since the quartz vibrating bars 6a and 7a are cut out of the quartz wafer 1 as being protected by the vibrating-bar-correspondent regions 6 and 7 from the above etching, the width of the surface of quartz vibrating bars 6a and 7a is coincident with the width W of the vibrating-bar-correspondent regions 6 and 7.

The width W of the vibrating-bar-correspondent regions 6, 7 and the quartz vibrating bars 6a, 7a is preferably equal to or larger than the thickness D thereof. The thickness D of the quartz vibrating bars 6a and 7a is the same as the thickness of quartz wafer 1, which is between 200 and 500 μm.

In etching of quartz the etch rate in the positive direction of the X-axis is different from that in the negative direction. Quartz is a triadically symmetric crystal and has two X-axes being perpendicular to the Z-axis and making angles of ±120° with the X-axis. These axes will be referred to as X1-axis and X2-axis. Because of the difference between these etch rates, the quartz vibrating bars 6a and 7a formed under the vibrating-bar-correspondent regions 6 and 7 each have corresponding projecting portions 20 and 21 projecting in the positive direction of the X-axis from immediately below the segments 11 and 14 of the vibrating-bar-correspondent regions 6 and 7. On the other hand, planes 20a and 21a opposite to the projecting portions 20 and 21 of the quartz vibrating bars 6a and 7a are parallel to the Y'Z' plane. Further, because of the above difference between the etch rates, the quartz vibrating bar 6a has a projecting portion 22 projecting in the positive direction of the X1-axis from immediately below the segment 13 at the root of the vibrating-bar-correspondent region 6 and the quartz vibrating bar 7a has a plane 22a perpendicular to the X2-axis immediately below the segment 17 at the root of the vibrating-bar-correspondent region 7. Heights $t_x$ of these projecting portions (etch residue) 20 to 22 are substantially the same and the height $t_x$ is within 8% of the thickness D. In other words, the above etching is continued before the maximum separation distance $t_x$ from a plane being perpendicular to the principal surface 1a and including either of the segments 11 and 14 to each side surface becomes 8% or less of the distance D between the principal surface 1a and the back surface 1b.

Further, the maximum separation distance from a plane including the segment 11 and being perpendicular to the principal surface 1a to the projecting portion 22 in the crotch portion is defined as W1. Magnitudes of W1 were measured where the quartz wafer was etched with the above U-shaped mask to form the crotch portion of quartz vibrator, and results of the measurement were as follows. When the quartz wafer 1 with the thickness D of 200 μm was etched for 200 minutes, the distance W1 was 172 μm. When the quartz wafer 1 with the thickness D of 300 μm was etched for 250 minutes, the distance W1 was 264 μm. When the quartz wafer 1 with the thickness D of 400 μm was etched for 200 minutes, the distance W1 was 372 μm. When the quartz wafer 1 with the thickness D of 500 μm was etched for 250 minutes, the distance W1 was 465 μm. Accordingly, the distance of metal mask 3 from the plane including the segment 10 and being perpendicular to the principal surface 1a to the intersecting point between the segment 13 and the segment 18 is preferably greater than the thickness D of quartz vibrating bar 6a or 7a. It is because the height $t_x$ of projection 22 can be made small (within 8% of the thickness D) by securing the etch time against the thickness D as described above.

The first segment 13 of the vibrating-bar-correspondent region 6 makes an angle of about 30° with respect to the positive direction of this X-axis. The X1-axis of quartz intersects at the angle of 120° with the positive direction of the X-axis. Accordingly, the X1-axis and the segment 13 of the crotch portion make an angle of about 90°.

Further, the second segment 17 of the vibrating-bar-correspondent region 7 makes an angle of about 150° with respect to the positive direction of the X-axis. The X2-axis intersects at the angle of −120° with the positive direction of the X-axis. Accordingly, the X2-axis and the second segment 17 make an angle of about 90°.

Since the first segment 13 and second segment 17 intersect at the angle of about 90° with the X1-axis and with the X2-axis, respectively, etching of quartz wafer 1 advances from the principal surface 1a of quartz wafer 1 into the inside thereof along the direction perpendicular to each of the X1-axis and the X2-axis with the first segment 13 and the second segment 12 of mask 3 being borders.

The first vibrating-bar-correspondent region 6 is defined by the region surrounded by the first segment 13 and the segments 10 to 12. By etching the quartz wafer 1 with the mask having this first vibrating-bar-correspondent region 6, the first quartz vibrating bar 6a is formed immediately below this region 6. The second vibrating-bar-correspondent region 7 is defined by the region surrounded by the second segment 17 and the segments 14 to 16, and by etching the quartz wafer 1 with the mask 3 having this region 7, the second quartz vibrating bar 7a is formed immediately below this region 7. Further, by etching the quartz wafer 1 with the mask 3 having the base-correspondent region 5, the base 5a is formed immediately below this region 5. During vibration of quartz vibrating bar the stress concentrates on the crotch portion of quartz vibrator comprised of the segment 18, first segment 13, and second segment 17, and etching of this crotch portion advances into the inside of quartz wafer 1 with the first segment 18 and second segment 17, respectively perpendicular to the X1-axis and the X2-axis, being borders. Accordingly, shapes of the side surfaces 22 and 22a of the two quartz vibrating bars 6a and 7a opposite to each other with this crotch portion in between can be made symmetric as compared with those made by the above conventional process, whereby the stress exerted on the two quartz vibrating bars 6a and 7a can be equalized.

After completion of etching, the metal masks 3 and 4 shown in FIG. 2 are removed and electrodes 23 to 34 are made on the quartz vibrating bars 6a and 7a by the photolithography technology, thereby forming the quartz vibrator 100. After formation of the electrodes 23 to 34, the quartz vibrator 100 is separated from the quartz portion immediately below the connecting region 3c of FIG. 2.

Figure 6:
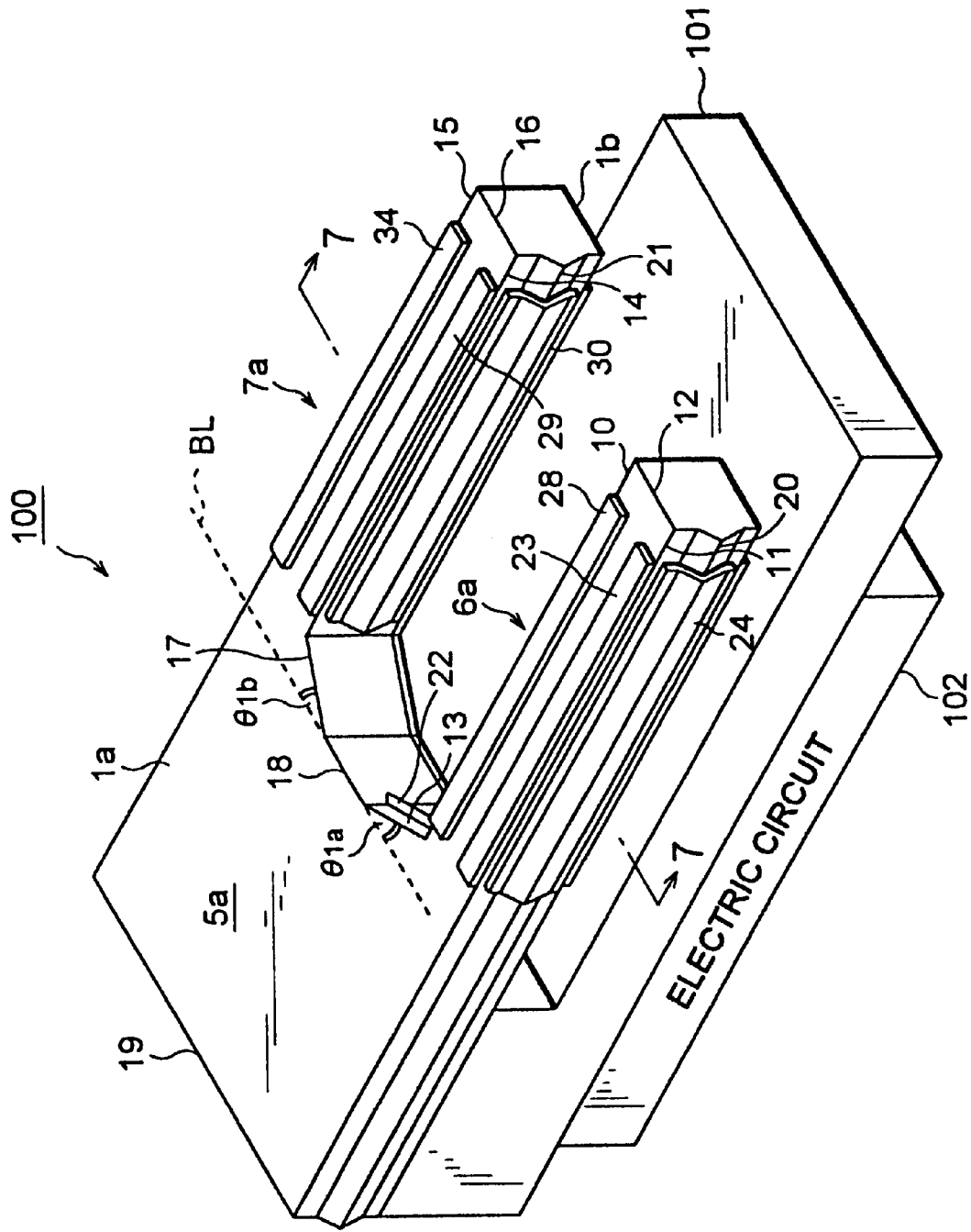
FIG. 6 is the angular velocity detecting apparatus provided with the quartz vibrator.
Figure 6:
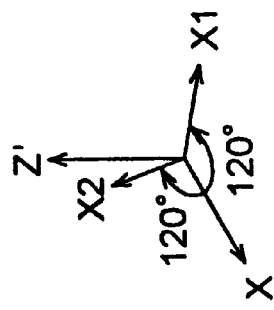
Figure 7:
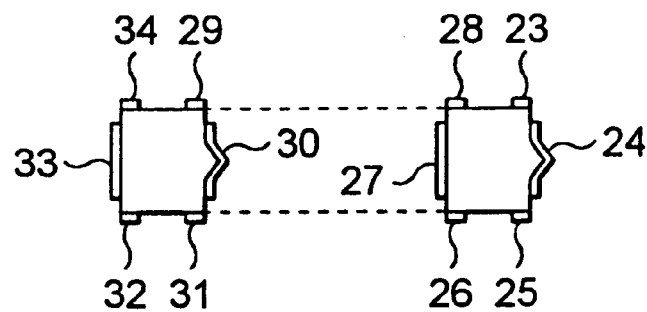
FIG. 7 is a cross-sectional view obtained by cutting the quartz vibrator of FIG. 6 along line A—A and observing it along the arrows.

FIG. 6 is a perspective view to show an angular velocity detecting apparatus in which the quartz vibrator 100 having the electrodes 23 to 34 is fixed on a fixing stage 101 and FIG. 7 is a cross-sectional view of the quartz vibrator 100 obtained by cutting the quartz vibrator 100 of FIG. 6 along line A—A and observing it along the arrows. This angular velocity detecting apparatus has an electric circuit 102 for applying a driving voltage for driving the quartz vibrating bars 6a and 7a in the directions along the X-axis to some of the electrodes 23 to 34 and for detecting signals corresponding to Z-directional vibration of the quartz vibrating bars 6a and 7a from some of the electrodes 23 to 34. Since Z'-directional vibration of the quartz vibrating bars 6a and 7a occurs according to the Coriolis' force, the product of the vibrating velocity in the X-axis directions of the quartz vibrating bars 6a and 7a by rotational force acting thereon about the longitudinal direction of the quartz vibrating bars 6a and 7a, the electric circuit 102 can detect the angular velocity acting on the angular velocity detecting apparatus.

Since the quartz vibrator 100 is made using the metal masks 3 and 4 shown in FIG. 4, the shape of the principal surface (plane) 1a is the same as that of the region 3b of metal mask 3. Accordingly, the shape of vibrator 100 is defined by using the same reference symbols as those for the region 3b and the description thereof is omitted. The shape of the back surface 1b of quartz vibrator 100 is the same as that of the principal surface 1a.

Next described is the reason why the above height $t_x$ is set to 8% or less of the thickness D.

Figure 8:
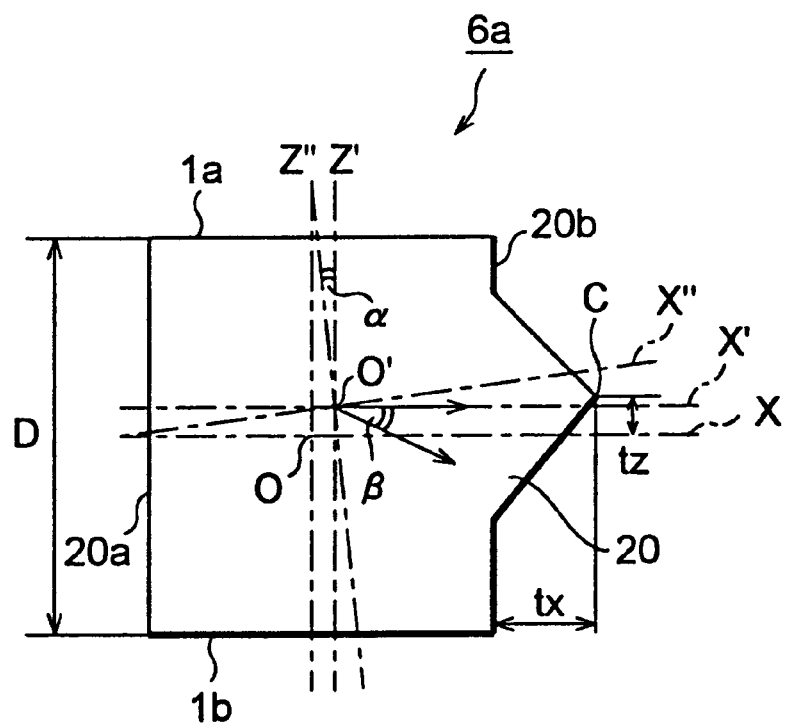
FIG. 8 is a cross-sectional view of the quartz vibrating bar.

FIG. 8 is an explanatory drawing to show a cross section of the quartz vibrating bar 6a extracted from FIG. 5. The cross section perpendicular to the Y'-axis of the quartz vibrating bar 6a has the principal surface 1a and back surface 1b parallel to the XY' plane, the left side surface 20a parallel to the Y'Z' plane, and the right side surface 20b opposite to the left side surface 20a. The principal surface 1a, the back surface 1b, and the left side surface 20a are planes, and the right side surface 20b is deflected so as to project in the positive direction of the X-axis. The projecting portion 20 is defined by the deflecting portion of the right side surface 20b. The height $t_x$ of the projecting portion 20 is defined by the distance from a plane including two intersecting lines between the upper and lower surfaces 1a, 1b and the right side surface 20b to the vertex C of the projecting portion 20. In the cross section of FIG. 8 "O" represents a position of the center of gravity of the quartz vibrating bar 6a without the projecting portion 20. A deviation amount $t_z$ of the projecting portion 20 is defined as a distance between the XY' plane including the center of gravity O and the vertex C'. In the cross section of FIG. 8, O' is defined as a position of the center of gravity of the quartz vibrating bar 6a with the projecting portion 20.

When the quartz vibrating bar 6a vibrates in the X-axis directions with the center of gravity O at the center, the principal axis of cross section deviates by an angle α relative to the Z'-axis (to be Z"-axis), because the center of gravity O of the quartz vibrating bar 6a is moved to the center of gravity O'. In that case, though the quartz vibrating bar 6a is made to vibrate in the X-axis directions, the quartz vibrating bar 6a vibrates along directions deviating by an angle β from the X'-axis. This vibration degrades stability of vibration of the quartz vibrator 100. In addition, for example, when this quartz vibrator 100 is applied to the angular velocity detecting apparatus, the above electric circuit 102 detects a leak vibration component in the Z-axis directions not based on the Coriolis' force, which lowers the accuracy of angular velocity detected by the electric circuit 102.

The amplitude tanβ of the leak vibration component in the Z-axis directions is dependent upon the deviation amount $t_z$. Namely, the amplitude tanβ of the leak vibration component increases in proportion with a ratio ($t_z$/D) of the deviation amount $t_z$ to the thickness D. Therefore, the stability of vibration of quartz vibrator 100 can be enhanced by decreasing the ratio $t_z$/D.

Figure 9:
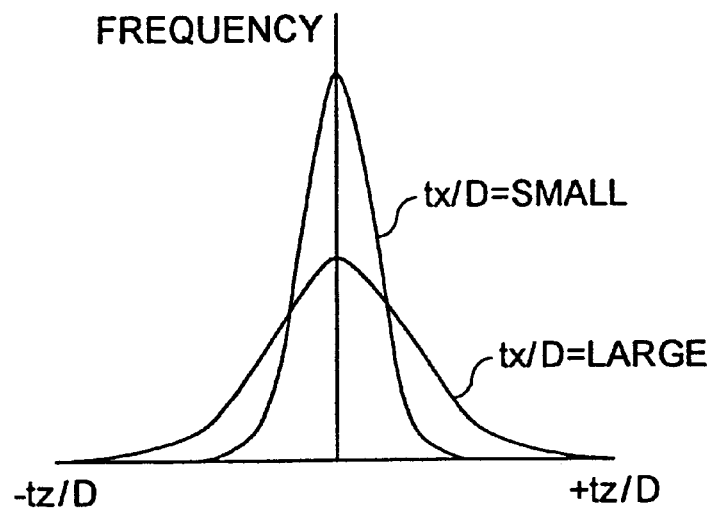
FIG. 9 is a graph to show frequency distributions of $t_z/D$ against $t_x/D$.

FIG. 9 is a graph to show the relationship between $t_x$/D and $t_z$/D, obtained when plural quartz vibrators 100 were manufactured. With large $t_x$/D, a probability that the quartz vibrator 100 with large $t_z$/D is manufactured becomes high; with small $t_x$/D, the quartz vibrator 100 with large $t_z$/D cannot be manufactured. If $t_x$/D is kept at 8% or less, $t_z$/D will drop within a predetermined value, whereby the quartz vibrator 100 achieving stable vibration can be manufactured.

Figure 10:
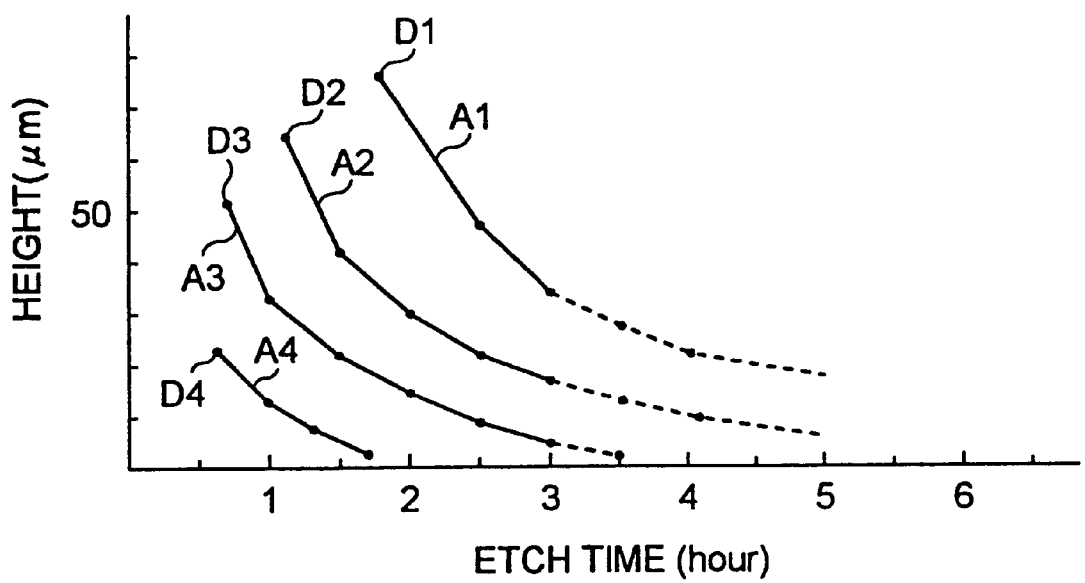
FIG. 10 is a graph to show the relationship between the etch time and the height of the projecting portion.

FIG. 10 is a graph to show the relationship between the etch time (unit: hour) of the quartz wafer 1 and the height $t_x$ of the projecting portion 20. Polygonal lines A1, A2, A3, A4 indicate data of quartz wafers having the thickness D=500 μm, 400 μm, 300 μm, 200 μm, respectively, and each quartz wafer was penetrated vertically at point D1 to D4. Dotted lines in the same drawing indicate a region where the metal masks under use start breaking to enlarge dispersion of etching whereby the quartz vibrator 100 achieving stable vibration cannot be manufactured. Accordingly, the etch time is desirably three or less hours. When the etch time is three hours and when the thickness D is 500 μm, the ratio $t_x/D$ is 7.8%. When the etch time is three hours and when the thickness D is 400 μm, the ratio $t_x/D$ is 5.0%. When the etch time is three hours and when the thickness D is 300 μm, the ratio $t_x/D$ is 2.6%.

Accordingly, in the case of the thickness D being 500 μm or less, etching is continued preferably until the ratio $t_x/D$ becomes between 8% and 7.8% both inclusive. In the case of the thickness D being 400 μm or less, etching is continued preferably until the ratio $t_x/D$ becomes between 8% and 5.0% both inclusive. In the case of the thickness D being 300 μm or less, etching is continued preferably until the ratio $t_x/D$ becomes between 8% and 3 (2.6)% both inclusive.

The shape of the segments defining the above metal masks 3 and 4 and the shape of the principal surface 1a and back surface 1b of the quartz vibrator 100 may be replaced by those described with FIG. 11 to FIG. 15. The shape of the metal mask on the bottom surface and the shape of the principal surface (plane) and the back surface (plane) of the quartz vibrator manufactured using the metal masks, of these examples, are the same as the shape of the metal mask on the top surface. Accordingly, only the shape of the metal mask on the top surface will be described and redundant description will be omitted in the following description. FIG. 11 to FIG. 15 are plan views of other quartz vibrator intermediates as illustrated in the same way as the plan view of the quartz vibrator intermediate 1' shown in FIG. 4. Further, the same reference symbols will be used for elements of the same structure as the vibrator-correspondent region 3b of the metal mask 3 and redundant description will be omitted.

The present applicant formed the crotch portion of quartz vibrator by etching the quartz wafer with the aforementioned U-shaped mask. It was found that this crotch portion was defined by the segment intersecting at the angle of 27.360° (about 30°) with the X-axis and extending toward the tip end of the first vibrating-bar-correspondent region, the segment intersecting at the angle of 37.439° (about 40°) with the X-axis and extending toward the tip end of the second vibrating-bar-correspondent region, and the segment intersecting at the angle of 84.395° (about 85°) with the X-axis and extending toward the tip end of the second vibrating-bar-correspondent region. Therefore, symmetry of this crotch portion can be enhanced more by forming the crotch portion between the opposite quartz vibrating bars, using a mask having segments extending along these segments based on the experimental data.

Figure 11:
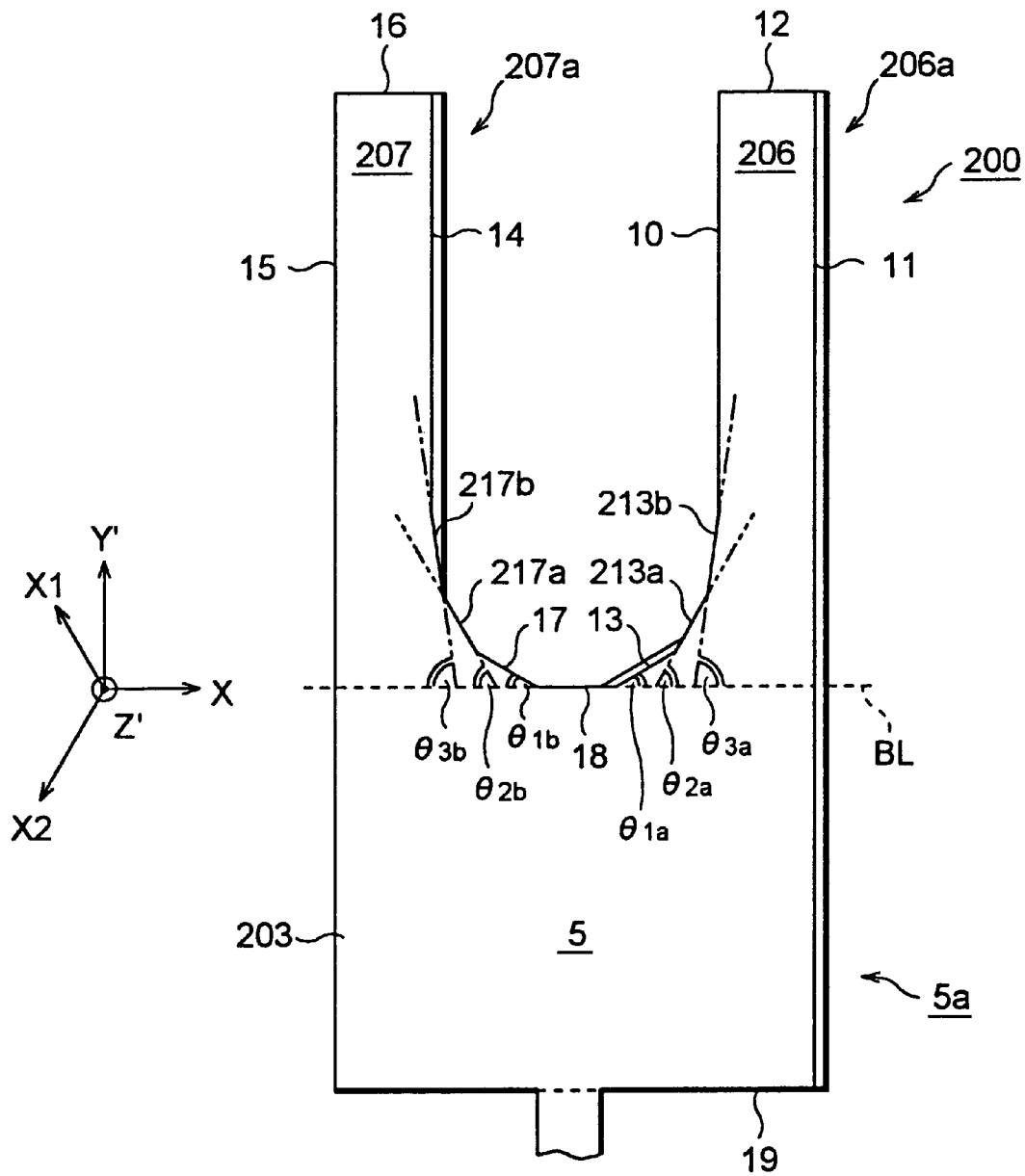
FIG. 11 is a plan view of another intermediate.

First described is the metal mask 203 of quartz vibrator intermediate 200 shown in FIG. 11.

The vibrating-bar-correspondent regions 206 and 207 of metal mask 203 extend in parallel with each other along the positive direction of the Y'-axis from one end of the base-correspondent region 5, and the quartz vibrating bars 206a and 207a are made immediately below the vibrating-bar-correspondent regions 206 and 207, respectively.

The vibrating-bar-correspondent region 206 has a third segment 213a continuing at one end thereof to the other end of the first segment 13 and extending in a direction to approach the tip end of the vibrating-bar-correspondent region 206 as making an angle of $\theta_{2a}$ with the X-axis, and a fourth segment 213b continuing at one end thereof to the other end of the third segment 213a and extending in a direction to approach the tip end of the first vibrating-bar-correspondent region as making an angle of $\theta_{3a}$ with the X-axis. Further, the vibrating-bar-correspondent region 207 has a fifth segment 217a continuing at one end thereof to the other end of the second segment 17 and extending in a direction to approach the tip end of the vibrating-bar-correspondent region 207 as making an angle of $\theta_{2b}$ with the X-axis, and a sixth segment 217b continuing at one end thereof to the other end of the fifth segment 217a and extending in a direction to approach the tip end of the vibrating-bar-correspondent region 207 as making an angle of $\theta_{3b}$ with the X-axis. The angles $\theta_{2a}$ and $\theta_{2b}$ each are 37.5±3° (about 40°). The angles $\theta_{3a}$ and $\theta_{3b}$ each are 84.5±6° (about 85°). The angles $\theta_{2a}$ and $\theta_{2b}$ each are not less than the angles $\theta_{1a}$ and $\theta_{1b}$.

Further, the above crotch portion of quartz wafer may be etched using a mask having approximate segments of an intermediate value of 60.917° (about 60°) between the above angles, instead of the segments of the above angles of 37.439° and 84.395°.

Figure 12:
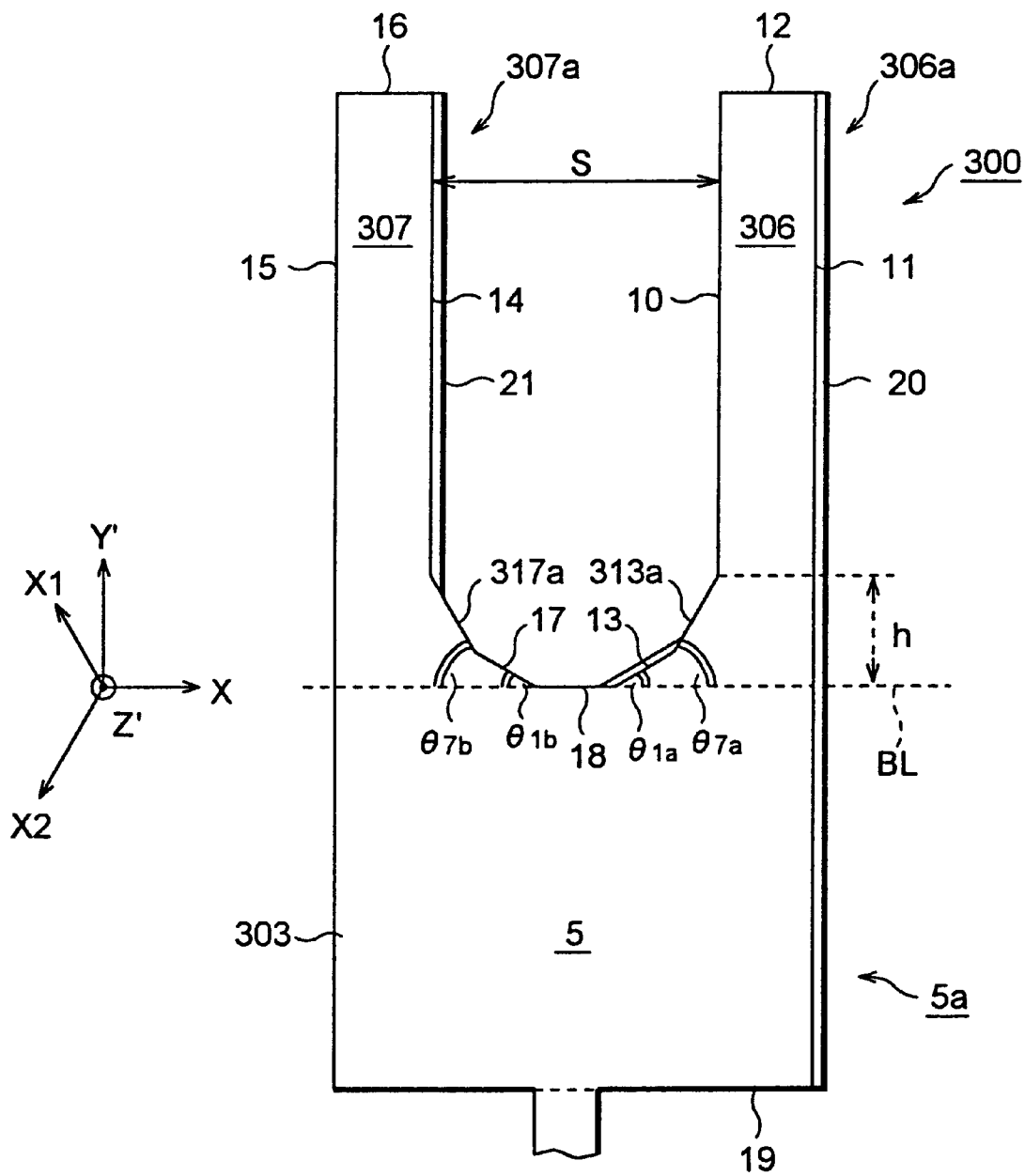
FIG. 12 is a plan view of another intermediate.

FIG. 12 shows the metal mask 303 of quartz vibrator intermediate 300 for carrying out such a method.

The vibrating-bar-correspondent regions 306 and 307 of metal mask 303 extend in parallel with each other along the positive direction of the Y'-axis from one end of the base-correspondent region 5, and the quartz vibrating bars 306a and 307a are formed immediately below the vibrating-bar-correspondent regions 306 and 307, respectively. The vibrating-bar-correspondent region 306 has a segment 313a continuing at one end thereof to the other end of the first segment 13 and extending in a direction to approach the tip end of the vibrating-bar-correspondent region 306 as making an angle of $\theta_{7a}$ with the X-axis. The vibrating-bar-correspondent region 307 has a segment 317a continuing at one end thereof to the other end of the second segment 17 and extending in a direction to approach the tip end of the vibrating-bar-correspondent region 307 as making an angle of $\theta_{7b}°$ with the X-axis. The angles $\theta_{7a}$ and $\theta_{7b}$ each are 60±60° (about 6020 ).

Here, the maximum separation distance between a plane including the segment 14 and being parallel to the Z'-axis and the projecting portion 21 is defined as W2. Further, the distance from this plane to the intersecting point between the segment 17 and the segment 18 is defined as W3. Here, magnitudes of W2 were measured where the quartz wafer was etched with the mask of the embodiment illustrated in FIG. 4 and results of the measurement were as follows.

The mask with the distance W3 being 0.2 mm was formed on the quartz wafer 1 with the thickness D being 0.2 mm (200 μm) and it was etched for 200 minutes. The distance W2 was 0.012 mm. Here, the cube of the thickness D is 0.008 mm³.

The mask with the distance W3 being 0.3 mm was formed on the quartz wafer 1 with the thickness D being 0.3 mm (300 μm) and it was etched for 250 minutes. Then the distance W2 was 0.038 mm. Here, the cube of the thickness D is 0.027 mm³. The mask with the distance W3 being 0.4 mm was formed on the quartz wafer 1 with the thickness D being 0.4 mm (400 μm) and it was etched for 200 minutes. Then the distance W2 was 0.084 mm. Here, the cube of the thickness D is 0.064 mm³. The mask with the distance W3 being 0.5 mm was formed on the quartz wafer 1 with the thickness D being 0.5 mm (500 μm) and it was etched for 250 minutes. Then the distance W2 was 0.136 mm. Here, the cube of the thickness D is 0.125 mm³. Accordingly, within the range of the thickness D between 0.2 and 0.5 (mm), the distance of metal mask 303 from the plane including the segment 14 and being parallel to the Z'-axis to the intersecting point between the segment 17 and the segment 317a is preferably set greater than the cube of the thickness D (mm). It is because the height $t_x$ of projection 21 can be made small (within 8% of the thickness D) by securing the etch time against the thickness D as described above.

Further, let S be the distance between the segment 10 and the segment 14. Let h be the distance from the intersecting point between the segment 10 and the segment 313a to the virtual line BL. If this distance S is long, mechanical linkage of vibration will be small when a pair of vibrating bars are vibrated in the X-axis directions. For increasing the mechanical linkage, it is preferred to lengthen the length of a segment as a projection of the segments 313a and 13 on the virtual line BL. Further, the ratio h/s is preferably between 0.2 and 0.4 both inclusive in consideration of ease of flow of etchant and arrangement of electrodes depending upon the distance S.

The above manufacture process of quartz vibrator was achieved in consideration of symmetry of a pair of quartz vibrating bars, but this may be achieved in consideration of symmetry of a single quartz vibrating bar.

Figure 13:
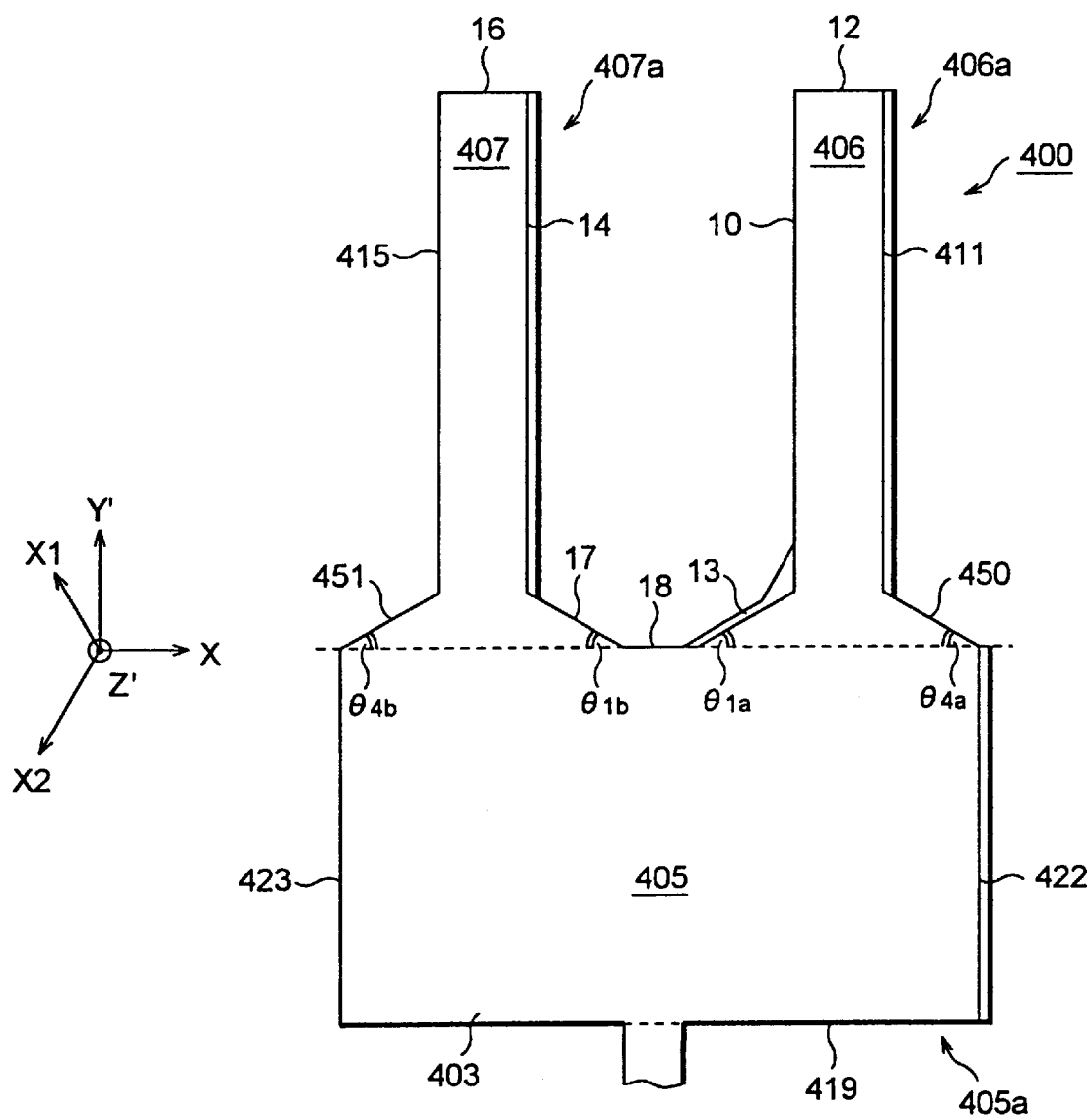
FIG. 13 is a plan view of another intermediate.

FIG. 13 shows the metal mask 403 of quartz vibrator intermediate 400 for carrying out such a process. The vibrating-bar-correspondent regions 406 and 407 of metal mask 403 extend in parallel with each other along the positive direction of the Y'-axis from one end of the base-correspondent region 405, and the base 405a and first and second quartz vibrating bars 406a, 407a are formed immediately below these regions, respectively. The base-correspondent region 405 is surrounded by segments 18, 419 parallel to the X-axis and segments 422, 423 parallel to the Y'-axis.

The vibrating-bar-correspondent region 406 is defined by a segment 450 continuing at one end thereof to the base-correspondent region 405 as being spaced a predetermined distance from the segment 13 and extending in a direction to approach the tip end of the vibrating-bar-correspondent region 406 as making an angle of $\theta_{4a}$ with the X-axis, and lines 10, 12, 411 continuing to the other end of the segment 13, going and returning along the longitudinal direction of the vibrating-bar-correspondent region 406, and reaching the other end of segment 450. The segment 411 is parallel to the Y'-axis.

The vibrating-bar-correspondent region 406 is defined by the region surrounded by the segments 13, 450 and the lines 10, 12, 411. Accordingly, by etching the quartz wafer 1 with the mask having this region 406, the quartz vibrating bar can be made immediately below this region. During vibration of quartz vibrating bar the stress concentrates on the root of the quartz vibrating bar comprised of the segments 13 and 450. Since in the present process the etching of the root of quartz vibrating bar advances in accordance with the crystal orientations of quartz defined by these segments 13 and 450, the shape of the side surfaces of quartz vibrating bar defined by this root portion can be made symmetric as compared with that made by the aforementioned conventional process, whereby the stress applied on the quartz vibrating bar made by the region 406 can be equalized.

The vibrating-bar-correspondent region 407 is defined by a segment 451 continuing at one end thereof to the base-correspondent region as being spaced a predetermined distance from the segment 17 and extending in a direction to approach the tip end of the vibrating-bar-correspondent region 407 as making an angle of $\theta_{4b}$ with the X-axis, and lines 14, 16, 415 continuing to the other end of segment 17, going and returning along the longitudinal direction of the vibrating-bar-correspondent region 407, and reaching the other end of segment 451. The segment 415 is parallel to the Y'-axis.

Here, the angles $\theta_{4a}$ and $\theta_{4b}$ each are 30±6°.

Further, taking symmetry of the left and right vibrating bars into consideration in addition, it is preferred to equalize $\theta_{1a}$ to $\theta_{1b}$ and to equalize $\theta_{4a}$ to $\theta_{4b}$. It is also permissible to equalize $\theta_{1a}$ to $\theta_{4a}$ and to equalize $\theta_{1b}$ to $\theta_{4b}$.

The mask shape taking account of symmetry of the left and right vibrating bars shown in FIG. 11 can be applied to the mask shape also taking account of symmetry of the single vibrating bar shown in FIG. 13.

Figure 14:
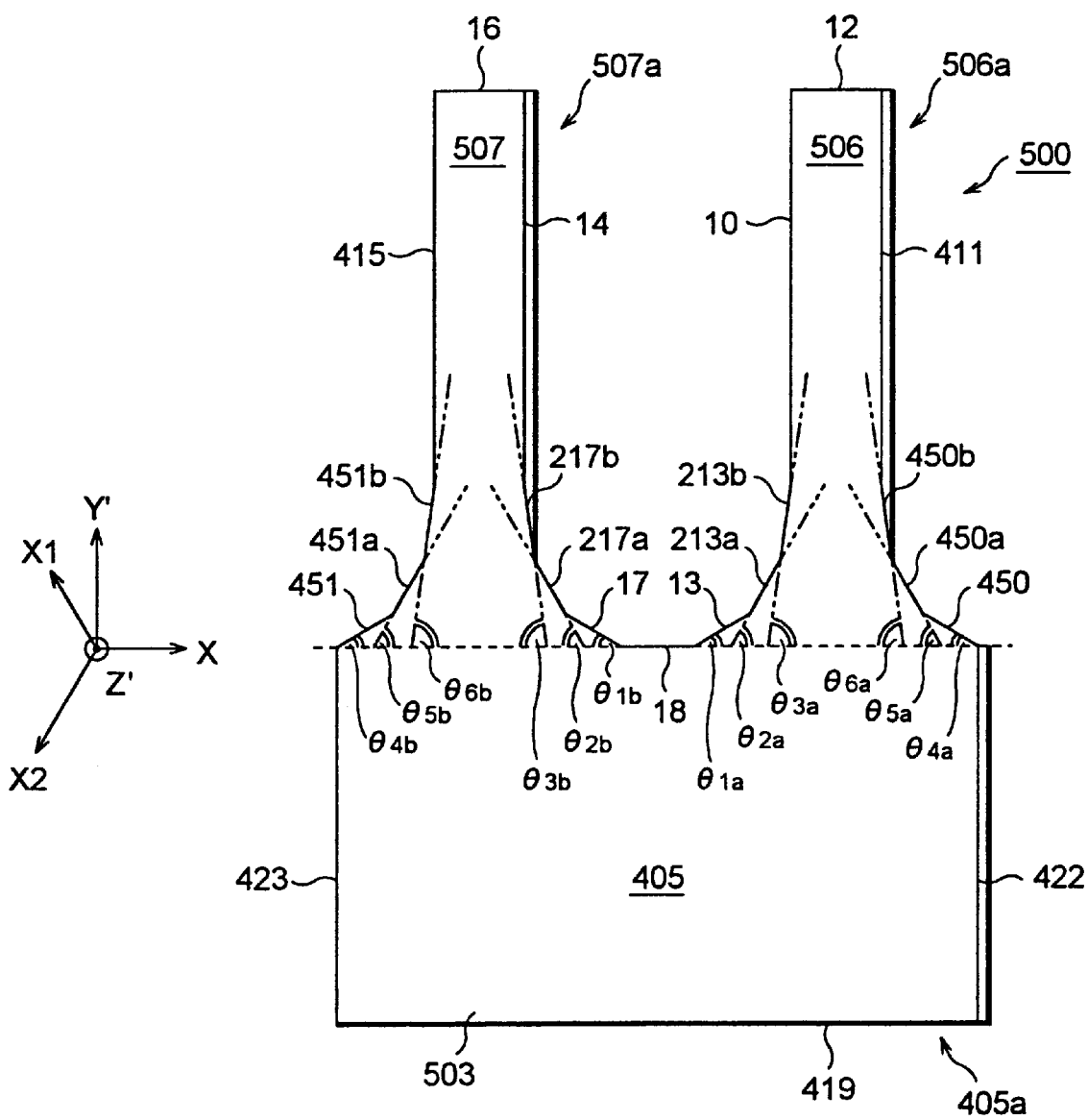
FIG. 14 is a plan view of another intermediate.

FIG. 14 shows such metal mask 503 and vibrator intermediate 500 made with this mask 503. The vibrating-bar-correspondent regions 506 and 507 of the metal mask 503 extend in parallel with each other along the positive direction of the Y'-axis from one end of the base-correspondent region 405, and the first and second quartz vibrating bars 506a, 507a are made immediately below the vibrating-bar-correspondent regions 506 and 507, respectively.

The vibrating-bar-correspondent region 506 has a segment 450a continuing at one end thereof to the other end of segment 450 and extending in a direction to approach the tip end of the vibrating-bar-correspondent region 506 as making an angle of $\theta_{5a}$ with the X-axis, and a segment 450b continuing at one end thereof to the other end of the segment 450a and extending in a direction to approach the tip end of the vibrating-bar-correspondent region 506 as making an angle of $\theta_{6a}$ with the X-axis.

Further, the vibrating-bar-correspondent region 507 has a segment 451a continuing at one end thereof to the other end of segment 451 and extending in a direction to approach the tip end of the vibrating-bar-correspondent region 507 as making an angle of $\theta_{5b}$ with the X-axis, and a segment 451b continuing at one end thereof to the other end of the segment 451a and extending in a direction to approach the tip end of the vibrating-bar-correspondent region 507 as making an angle of $\theta_{6b}$ with the X-axis.

From the aforementioned result of experiment, the angles $\theta_{4a}$ and $\theta_{4b}$ each are 30±6° (about 30°), the angles $\theta_{5a}$ and $\theta_{5b}$ each are 37.5±3° (about 40°), and the angles $\theta_{6a}$ and $\theta_{6b}$ each are 84.5±6° (about 85°).

Figure 15:
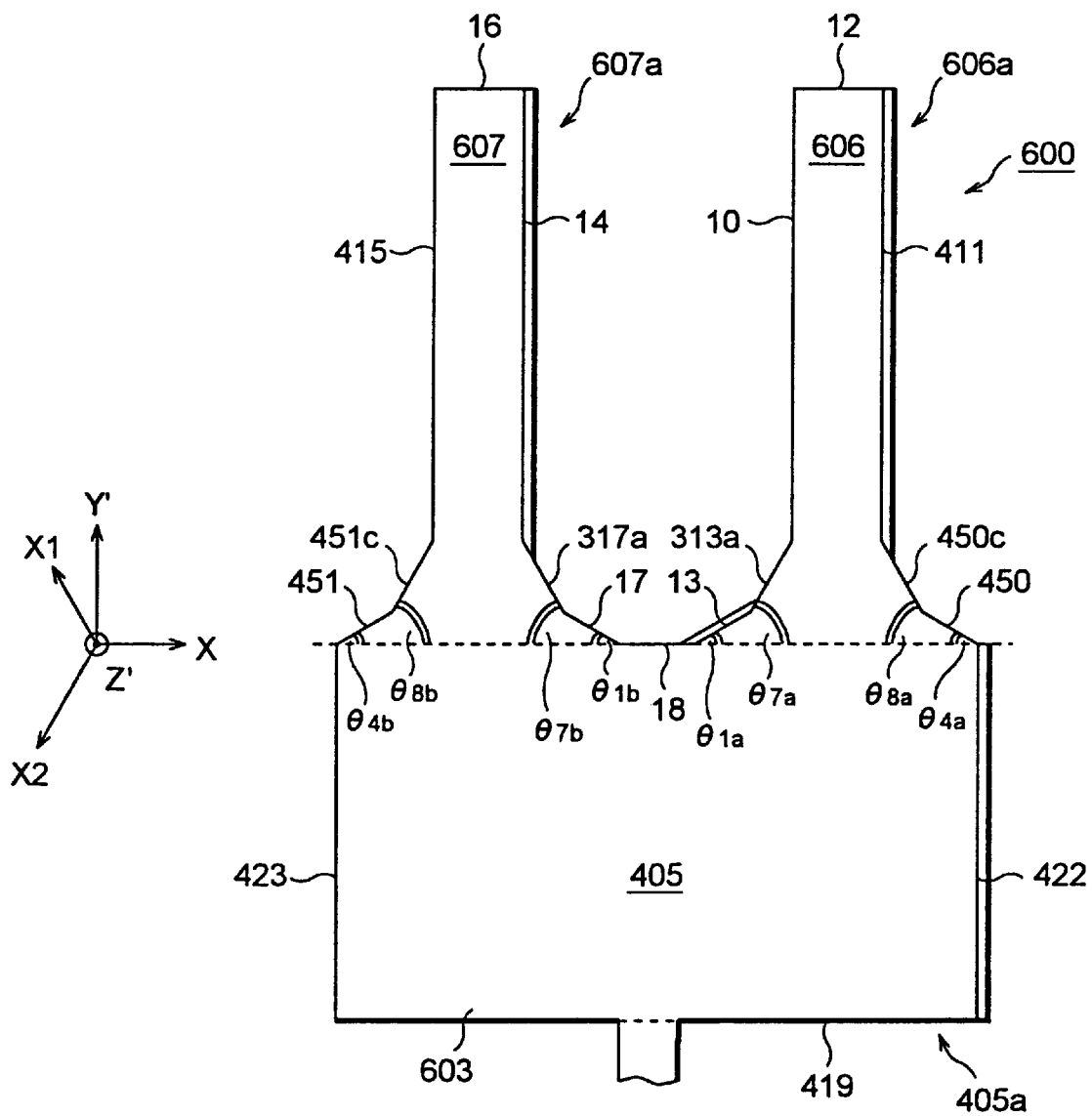
FIG. 15 is a plan view of another intermediate.

These angles may be set approximately, thereby forming the metal mask 603 shown in FIG. 15 on the quartz vibrator intermediate 60°. This mask 603 has the vibrating-bar-correspondent regions 606 and 607 extending in the same direction from the base-correspondent region 405, and the first and second quartz vibrating bars 606a, 607a are formed immediately below the vibrating-bar-correspondent regions 606 and 607, respectively.

The vibrating-bar-correspondent region 606 has a segment 450c continuing at one end thereof to the other end of the segment 450 and extending in a direction to approach the tip end of the vibrating-bar-correspondent region 606 as making an angle of $\theta_{8a}$ with the X-axis.

Further, the vibrating-bar-correspondent region 607 has a segment 451c continuing at one end thereof to the other end of the segment 451 and extending in a direction to approach the tip end of the vibrating-bar-correspondent region 607 as making an angle of $\theta_{8b}$ with the X-axis. $\theta_{8a}$ and $\theta_{8b}$ each are 60±6° (about 60°).

As described above, the methods of quartz vibrator according to the above embodiments are directed to the process for manufacturing the quartz vibrator 100 provided with the base 5a of quartz and the first and second quartz vibrating bars 6a and 7a extending in the same direction from the base 5a and being capable of vibrating with application of voltage thereto.

The process as described using FIG. 1 to FIG. 7 comprises the step of preparing the quartz wafer 1 which has the principal surface 1a perpendicular to the axis (Z'-axis) extending along the Z-axis of quartz (FIG. 1), the step of forming on the principal surface 1a the mask 3 which has the base-correspondent region 5 and the first and second vibrating-bar-correspondent regions 6, 7 extending in the same direction along the axis (Y'-axis) perpendicular to the predetermined X-axis of quartz wafer 1 from the base-correspondent region 5, and the step of forming the base 5a and the first and second quartz vibrating bars 6a, 7a immediately below the base-correspondent region 5 and below the first and second vibrating-bar-correspondent regions 6, 7, respectively, of the mask 3.

Here, the perimeter of the base-correspondent region 5 has the predetermined portion 18 extending along the X-axis as being located between the first and second vibrating-bar-correspondent regions 6, 7, the perimeter of the first vibrating-bar-correspondent region 6 has the first segment 13 continuing at one end thereof to one end of the predetermined portion 18 and extending in the direction to approach the tip end of the first vibrating-bar-correspondent region 6 as making the angle of about 30° with the X-axis, and the perimeter of the second vibrating-bar-correspondent region 7 has the second segment 17 continuing at one end thereof to the other end of the connecting line 18 and extending in the direction to approach the tip end of the second vibrating-bar-correspondent region 7 as making the angle of about 30° with the X-axis.

Since in the present process the etching of the crotch portion of quartz vibrator defined by the predetermined portion 18, the first segment 13, and the second segment 17 advances in accordance with the crystal orientations of quartz, the shape of the side surfaces of the two quartz vibrating bars opposite to each other with this crotch portion in between can be made symmetric, whereby the stress applied on the both quartz vibrating bars can be equalized. Accordingly, the shape of etch residues 22 and 22a can be made symmetric as compared with that in the prior art, which stabilizes vibration of the manufactured quartz vibrator.

Further, according to the process using the mask 203 shown in FIG. 11, the perimeter of the first vibrating-bar-correspondent region 206 has the third segment 213a continuing at one end thereof to the other end of the first segment 13 and extending in the direction to approach the tip end of the first vibrating-bar-correspondent region 206 as making the angle of about 40° with the X-axis, and the fourth segment 213b continuing at one end thereof to the other end of the third segment 213a and extending in the direction to approach the tip end of the first vibrating-bar-correspondent region 206 as making the angle of about 85° with the X-axis, and the perimeter of the second vibrating-bar-correspondent region 207 has the fifth segment 217a continuing at one end thereof to the other end of the second segment 17 and extending in the direction to approach the tip end of the second vibrating-bar-correspondent region 207 as making the angle of about 40° with the X-axis, and the sixth segment 217b extending in the direction to approach the tip end of the second vibrating-bar-correspondent region 207 as making the angle of about 85° with the X-axis.

Further, according to the process using the mask 303 shown in FIG. 12, the perimeter of the first vibrating-bar-correspondent region 306 has the segment 313a continuing at one end thereof to the other end of the first segment 13 and extending in the direction to approach the tip end of the first vibrating-bar-correspondent region 306 as making the angle of about 60° with the X-axis, and the perimeter of the second vibrating-bar-correspondent region 307 has the segment 317a continuing at one end thereof to the other end of the second segment 17 and extending in the direction to approach the tip end of the second vibrating-bar-correspondent region 307 as making the angle of about 60° with the X-axis.

The manufacture processes of quartz vibrator shown in FIG. 1 to FIG. 12 were achieved in consideration of symmetry of a pair of quartz vibrating bars, but they may be made in consideration of symmetry of single quartz vibrating bar.

According to the process using the mask 403 shown in FIG. 13, the perimeter of the vibrating-bar-correspondent region 406 has the first segment 13 continuing at one end thereof to the base-correspondent region 405 and extending in the direction to approach the tip end of the vibrating-bar-correspondent region 406 as making the angle of about 30° with the X-axis, and the second segment 450 continuing at one end thereof to the base-correspondent region 405 as being spaced the predetermined distance from the first segment 13 and extending in the direction to approach the tip end of the vibrating-bar-correspondent region 406 as making the angle of about 30° with the X-axis.

In this case, during vibration of quartz vibrating bar the stress concentrates on the root portion of quartz vibrating bar comprised of the first segment 13 and the second segment 450. Since in the present process the etching of the root portion of quartz vibrating bar advances in accordance with the crystal orientations of quartz defined by these segments 13, 450, the shape of the side surfaces of quartz vibrating bar defined by this root portion can be made symmetric, whereby the stress applied to the quartz vibrating bar 406 can be equalized.

Further, according to the process using the mask 503 shown in FIG. 14, the perimeter of the vibrating-bar-correspondent region 506 has the third segment 213a continuing at one end thereof to the other end of the first segment 13 and extending in the direction to approach the tip end of the vibrating-bar-correspondent region 506 as making the angle of about 40° with the X-axis, the fourth segment 213b continuing at one end thereof to the other end of the third segment 213a and extending in the direction to approach the tip end of the vibrating-bar-correspondent region 506 as making the angle of about 85° with the X-axis, the fifth segment 450a continuing at one end thereof to the other end of the second segment 450 and extending in the direction to approach the tip end of the vibrating-bar-correspondent region 506 as making the angle of about 40° with the X-axis, and the sixth segment 450b continuing at one end thereof to the other end of the fifth segment 450a and extending in the direction to approach the tip end of the vibrating-bar-correspondent region 506 as making the angle of about 85° with the X-axis.

Further, according to the process using the mask 603 shown in FIG. 15, the vibrating-bar-correspondent region 606 has the segment 313a continuing at one end thereof to the other end of the first segment 13 and extending in the direction to approach the tip end of the vibrating-bar-correspondent region 606 as making the angle of about 60° with the X-axis, and the segment 450c continuing at one end thereof to the other end of the second segment 450 and extending in the direction to approach the tip end of the vibrating-bar-correspondent region 606 as making the angle of about 60° with the X-axis.

Since the etching advances in accordance with the crystal orientations of quartz in either one of the above processes, the shape of etch residue becomes symmetric as compared with that in the conventional process, whereby vibration of the quartz vibrator manufactured can be stabilized.

The quartz vibrating bar 6a shown in FIG. 8 has the projecting portion 20 on the side surface extending along the perimeter of the vibrating-bar-correspondent region 6 as being located between the principal surface 1a and the back surface 1b opposite to the principal surface 1a. Here, the above etching is continued preferably before the height $t_x$ of this projecting portion 20 becomes 8% or less of the distance D between the principal surface 1a and the back surface 1b. Since vibration can be stabilized sufficiently by etching the above crotch portion or root portion of quartz wafer 1 up to 8% or less of the thickness D of the quartz vibrating bar 6a, the quartz vibrator capable of vibrating stably can be manufactured in this necessary and minimum etch time.

Here, the size of the metal mask is determined based on the size of etch residue at the crotch portion made when etching is continued until the height $h_z$ of the projecting portion 20 becomes 8% or less of the thickness D of the quartz vibrating bar 6a.

Further, the perimeter of the vibrating-bar-correspondent region preferably comprises the seventh segment 10 continuing at one end thereof to the other end of the first segment 13 and extending along the direction (the Y'-axis) perpendicular to the X-axis of quartz, the eighth segment 12 continuing at one end thereof to the other end of the foregoing seventh segment 10 and extending along the X-axis of quartz, and the ninth segment 11 continuing at one end thereof to the other end of the foregoing eighth segment 12 and extending toward the aforementioned base-correspondent region 5 along the X-axis of quartz.

In this case, since the third segment 10 and fifth segment 11 both extend along the X-axis of quartz, the quartz vibrating bar 6a is etched from the principal surface 1a of quartz wafer 1 into the inside thereof along the direction (Y') perpendicular to the X-axis with these segments 10 and 11 being borders. Accordingly, the present process can make more symmetric the shape of the quartz vibrating bar 6a cut out of the quartz wafer 1 with these segments 10 and 11 being borders.

Further, the quartz vibrator manufactured by the process as described with FIG. 1 to FIG. 7 is the quartz vibrator 100 provided with the base 5a having the predetermined region 5 including the plane perpendicular to the axis (the Z'-axis) along the Z-axis of quartz and provided with the first and second quartz vibrating bars 6a, 7a respectively having the first and second regions 6, 7 including the foregoing plane, extending in the same direction along the axis (the Y'-axis) along the Y-axis of quarts from the base 5a, and being capable of vibrating with application of voltage thereto, wherein the perimeter of the predetermined region 5 has the predetermined portion 18 extending along the X-axis of quartz as being located between the first and second quartz vibrating bars 6a, 7a, wherein the perimeter of the first region 6 has the first segment 13 continuing at one end thereof to one end of the predetermined portion 18 of the predetermined region 5 and extending in the direction to approach the tip end of the first quartz vibrating bar 6a as making the angle of about 30° with the foregoing X-axis, and wherein the perimeter of the second region 7 has the second segment 17 continuing at one end thereof to the other end of the predetermined portion 18 of the predetermined region 5 and extending in the direction to approach the tip end of the second quartz vibrating bar as making the angle of about 30° with the foregoing X-axis.

The present quartz vibrator can undertake stable vibration, because the shape of the crotch portion between the first and second quartz vibrating bars 6a, 7a, defined by the predetermined portion 18 and the first and second segments 13, 17, can be made symmetric upon manufacture thereof, as described above.

Further, the quartz vibrator manufactured by the process as described with FIG. 13 is the quartz vibrator 40° provided with the base 405a having the predetermined region 405 including the plane perpendicular to the axis (the Z'-axis) along the Z-axis of quartz and provided with the quartz vibrating bar 406a having the first region 406 including the foregoing plane, extending along the axis (the Y'-axis) along the Y-axis of quarts from the base 405a, and being capable of vibrating with application of voltage thereto, wherein the perimeter of the first region 406 has the first segment 13 continuing at one end thereof to the predetermined region 405 and extending in the direction to approach the tip end of the quartz vibrating bar 406a as making the angle of about 30° with the X-axis of quartz, and the second segment 450 continuing at one end thereof to the predetermined region 405 as being spaced the predetermined distance from the first segment 13 and extending in the direction to approach the tip end of the quartz vibrating bar as making the angle of about 30° with the foregoing X-axis.

The present quartz vibrator can undertake stable vibration, because the shape of the root portion of quartz vibrating bar defined by the first and second segments 13, 450 can be made symmetric upon manufacture thereof, as described above.

The quartz vibrators with two quartz vibrating bars were described according to the manufacture processes of quartz vibrator according to the above embodiments, but the present invention is by no means limited to these. The present invention can be also applied to manufacture processes of quartz vibrators with one quartz vibrating bar or with three or more quartz vibrating bars.

As described above, the present invention can provide the quartz vibrators capable of stable vibration, because the etching advances in accordance with the crystal orientations of quartz.

As described above, the process for manufacturing a quartz vibrator which has a base (5a) of quartz and first and second quartz vibrating bars (6a, 7a) extending in a same direction from the base (5a) and being capable of vibrating with application of voltage thereto, the process comprises the steps of: (a) preparing a quartz wafer (1) which has a principal surface (1a) perpendicular to an axis (Z') extending along the Z-axis of quartz; (b) forming on the principal surface (1a) a mask (3, 203, 303, 403, 503, 603) which has a base-correspondent region (5, 405) and first and second vibrating-bar-correspondent regions (6, 7, 206, 207, 306, 307, 406, 407, 506, 507, 606, 607) extending in a same direction along an axis (Y') perpendicular to a predetermined X-axis of the quartz wafer (1) from the base-correspondent region (5, 405); and (c) etching the quartz wafer (1) with the mask (3, 203, 303, 403, 503, 603) formed thereon, thereby forming the base (5a) and the first and second quartz vibrating bars (6a, 7a) immediately below the base-correspondent region (5, 405) and below the first and second vibrating-bar-correspondent regions (**6, 7, 206, 207, 306, 307, 406, 407, 506, 507, 606, 607), respectively, of the mask (3, 203, 303, 403, 503, 603).

The perimeter of the base-correspondent region (5, 405) has a predetermined portion (18) located between the first and second vibrating-bar-correspondent regions (6, 7, 206, 207, 306, 307, 406, 407, 506, 507, 606, 607) and extending along the X-axis; a perimeter of the first vibrating-bar-correspondent region (6, 206, 306, 406, 506, 606) has a first segment (13) continuing at one end thereof to one end of the predetermined portion (18) of the base-correspondent region (5, 405) and extending in a direction to approach a tip end of the first vibrating-bar-correspondent region (6, 206, 306, 406, 506, 606) as making an angle of about 30° with the X-axis; and a perimeter of the second vibrating-bar-correspondent region (7, 207, 307, 407, 507, 607) has a second segment (17) continuing at one end thereof to the other end of the predetermined portion (18) of the base-correspondent region (5, 405) and extending in a direction to approach a tip end of the second vibrating-bar-correspondent region (7, 207, 307, 407, 507, 607) as making an angle of about 30° with the X-axis.

Further, the perimeter of the first vibrating-bar-correspondent region (206, 506) has a third segment (213a) continuing at one end thereof to the other end of the first segment (13) and extending in a direction to approach the tip end of the first vibrating-bar-correspondent region (206, 506) as making an angle of about 40° with the X-axis, and a fourth segment (213b) continuing at one end thereof to the other end of the third segment (213a) and extending in a direction to approach the tip end of the first vibrating-bar-correspondent region (206, 506) as making an angle of about 85° with the X-axis, and the perimeter of the second vibrating-bar-correspondent region (207, 507) has a fifth segment (217a) continuing at one end thereof to the other end of the second segment (17) and extending in a direction to approach the tip end of the second vibrating-bar-correspondent region (207, 507) as making an angle of about 40° with the X-axis, and a sixth segment (217b) continuing at one end thereof to the other end of the fifth segment (218a) and extending in a direction to approach the tip end of the second vibrating-bar-correspondent region (207, 507) as making an angle of about 85° with the X-axis.

Further, the perimeter of the first vibrating-bar-correspondent region (306, 606) has a segment (313a) continuing at one end thereof to the other end of the first segment (13) and extending in a direction to approach the tip end of the first vibrating-bar-correspondent region (306, 606) as making an angle of about 60° with the X-axis; and the perimeter of the second vibrating-bar-correspondent region (307, 607) has a segment (317a) continuing at one end thereof to the other end of the second segment (17) and extending in a direction to approach the tip end of the second vibrating-bar-correspondent region (307, 607) as making an angle of about 60° with the X-axis.

Further, The process for manufacturing a quartz vibrator which has a base (5a) of quartz and a quartz vibrating bar (6a) extending from the base (5a) and being capable of vibrating with application of voltage thereto, the process comprises the steps of: preparing a quartz wafer (1) which has a principal surface (1a) perpendicular to an axis (Z') extending along the Z-axis of quartz; forming on the principal surface (1a) a mask (403, 503, 603) which has a base-correspondent region (405) and a vibrating-bar-correspondent region (406, 506, 606) extending along an axis (Y') perpendicular to a predetermined X-axis of the quartz wafer (1) from the base-correspondent region (405); and etching the quartz wafer (1) with the mask (403, 503, 603) formed thereon, thereby forming the base (5a) and the quartz vibrating bar (6a) immediately below the base-correspondent region (405) and below the vibrating-bar-correspondent region (406, 506, 606), respectively, of the mask (403, 503, 603).

The perimeter of the vibrating-bar-correspondent region (406, 506, 606) has: a first segment (13) continuing at one end thereof to the base-correspondent region (405) and extending in a direction to approach a tip end of the vibrating-bar-correspondent region (406, 506, 606) as making an angle of about 30° with the X-axis, and a second segment (450) continuing at one end thereof to the base-correspondent region (405) as being spaced a predetermined distance from the first segment (13) and extending in a direction to approach the tip end of the vibrating-bar-correspondent region (406, 506, 606) as making an angle of about 30° with the X-axis.

Further, the perimeter of the vibrating-bar-correspondent region (506) has: a third segment (213a) continuing at one end thereof to the other end of the first segment (13) and extending in a direction to approach the tip end of the vibrating-bar-correspondent region (506) as making an angle of about 40° with the X-axis, a fourth segment (213b) continuing at one end thereof to the other end of the third segment (213a) and extending in a direction to approach the tip end of the vibrating-bar-correspondent region (506) as making an angle of about 85° with the X-axis, a fifth segment (450a) continuing at one end thereof to the other end of the second segment (450) and extending in a direction to approach the tip end of the vibrating-bar-correspondent region (506) as making an angle of about 40° with the X-axis, and a sixth segment (450b) continuing at one end thereof to the other end of the fifth segment (450a) and extending in a direction to approach the tip end of the vibrating-bar-correspondent region (506) as making an angle of about 85° with the X-axis.

Further, the perimeter of the vibrating-bar-correspondent region (606) has: a segment (313a) continuing at one end thereof to the other end of the first segment (13) and extending in a direction to approach the tip end of the vibrating-bar-correspondent region (606) as making an angle of about 60° with the X-axis, and a segment (450c) continuing at one end thereof to the other end of the second segment (450) and extending in a direction to approach the tip end of the vibrating-bar-correspondent region (606) as making an angle of about 60° with the X-axis.

Further, the quartz vibrating bar has a projecting portion (20) on a side surface located between the principal surface (1a) and a back surface (1b) opposite to the principal surface (1a) and extending along the perimeter of the vibrating-bar-correspondent region, and the etching is continued before a height (tx) of the projecting portion (20) becomes 8% or less of a distance (D) between the principal surface (1a) and the back surface (1b).

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No.8-197813 (197813/1996) filed on Jul. 26, 1997 is hereby incorporated by reference.

What is claimed is:

1. A process for manufacturing a quartz vibrator which has a base of quartz and first and second quartz vibrating bars extending in a same direction from said base and capable of vibrating with an application of a voltage thereto, said process comprising the steps of:

preparing a quartz wafer which has a principal surface perpendicular to an axis extending along the z-axis of said quartz wafer;

forming on said principal surface, a mask which has a base-correspondent region and first and second vibrating-bar-correspondent regions extending in a same direction along an axis perpendicular to the X-axis of said quartz wafer from said base-correspondent region; and etching said quartz wafer with said mask formed thereon, thereby forming said base and said first and second quartz vibrating bars immediately below said base-correspondent region and below said first and second vibrating-bar-correspondent regions, respectively, of said mask, wherein a perimeter of said base-correspondent region has a portion located between said first and second vibrating-bar-correspondent regions and extending along said X-axis, wherein a perimeter of said first vibrating-bar correspondent region has a first segment continuing at one end thereof to one end of said portion of said base-correspondent region and extending in a direction to approach a tip end of said first vibrating-bar-correspondent region as making an angle of about 30° with said X-axis, and wherein a perimeter of said second vibrating-bar-correspondent region has a second segment continuing at one end thereof to the other end of said portion of said base-correspondent region and extending in a direction to approach a tip end of said second vibrating-bar-correspondent region, as making an angle of about 30° with said X-axis.

2. The process for manufacturing the quartz vibrator according to claim 1, wherein the perimeter of said first vibrating-bar-correspondent region has a third segment continuing at one end thereof to the other end of said first segment and extending in a direction to approach the tip end of said first vibrating-bar-correspondent region as making an angle of about 40° with said X-axis, and a fourth segment continuing at one end thereof to the other end of said third segment and extending in a direction to approach the tip end of said first vibrating-bar-correspondent region as making an angle of about 85° with said X-axis, and wherein the perimeter of said second vibrating-bar-correspondent region has a fifth segment continuing at one end thereof to the other end of said second segment and extending in a direction to approach the tip end of said second vibrating-bar-correspondent region as making an angle of about 40° with said X-axis, and a sixth segment continuing at one end thereof to the other end of said fifth segment and extending in a direction to approach the tip end of said second vibrating-bar-correspondent region as making an angle of about 85° with said X-axis.

3. The process for manufacturing the quartz vibrator according to claim 1, wherein the perimeter of said first vibrating-bar-correspondent region has a segment continuing at one end thereof to the other end of said first segment and extending in a direction to approach the tip end of said first vibrating-bar-correspondent region as making an angle of about 60° with said X-axis, and wherein the perimeter of said second vibrating-bar-correspondent region has a segment continuing at one end thereof to the other end of said second segment and extending in a direction to approach the tip end of said second vibrating-bar-correspondent region as making an angle of about 60° with said X-axis.

4. A process for manufacturing a quartz vibrator which has a base of quartz and a quartz vibrating bar extending from said base and being capable of vibrating with an application of a voltage thereto, the process comprising the steps of:

preparing a quartz wafer which has a principal surface perpendicular to an axis extending along the Z-axis of said quartz wafer;

forming on said principal surface, a mask which has a base-correspondent region and a vibrating-bar-correspondent region extending along an axis perpendicular to the X-axis of said quartz wafer from said base-correspondent region; and etching said quartz wafer with said mask formed thereon, thereby forming said base and said quartz vibrating bar immediately below said base-correspondent region and below said vibrating-bar-correspondent region, respectively, of said mask, wherein a perimeter of said vibrating-bar-correspondent region has:

a first segment continuing at one end thereof to said base-correspondent region and extending in a direction to approach a tip end of said vibrating-bar-correspondent region as making an angle of about 30° with said X-axis, and a second segment continuing at one end thereof to said base-correspondent region as being spaced a distance from said first segment and extending in a direction to approach the tip end of said vibrating-bar-correspondent region as making an angle of about 30° with said X-axis.

5. The process for manufacturing the quartz vibrator according to claim 4, wherein the perimeter of said vibrating-bar-correspondent region has:

a third segment continuing at one end thereof to the other end of said first segment and extending in a direction to approach the tip end of said vibrating-bar-correspondent region as making an angle of about 40° with said X-axis, a fourth segment continuing at one end thereof to the other end of said third segment and extending in a direction to approach the tip end of said vibrating-bar-correspondent region as making an angle of about 85° with said X-axis, a fifth segment continuing at one end thereof to the other end of said second segment and extending in a direction to approach the tip end of said vibrating-bar-correspondent region as making an angle of about 40° with said X-axis, and a sixth segment continuing at one end thereof to the other end of said fifth segment and extending in a direction to approach the tip end of said vibrating-bar-correspondent region as making an angle of about 85° with said X-axis.

6. The process for manufacturing the quartz vibrator according to claim 4, wherein the perimeter of said vibrating-bar-correspondent region has:

a segment continuing at one end thereof to the other end of said first segment and extending in a direction to approach the tip end of said vibrating-bar-correspondent region as making an angle of about 60° with said X-axis, and a segment continuing at one end thereof to the other end of said second segment and extending in a direction to approach the tip end of said vibrating-bar-correspondent region as making an angle of about 60° with said X-axis.

7. The process for manufacturing the quartz vibrator according claim 1, wherein one of said quartz vibrating bars has a projecting portion on a side surface located between said principal surface and a back surface opposite to said principal surface and extending along the perimeter of said vibrating-bar-correspondent region, and wherein said etching is continued before a height of said projecting portion becomes 8% or less of a distance between said principal surface and said back surface.

8. The process for manufacturing the quartz vibrator according claim 4, wherein said quartz vibrating bar has a projecting portion on a side surface located between said principal surface and a back surface opposite to said principal surface and extending along the perimeter of said vibrating-bar-correspondent region, and wherein said etching is continued before a height of said projecting portion becomes 8% or less of a distance between said principal surface and said back surface.

9. A process for manufacturing a quartz vibrator, said process comprising the steps of:

preparing a quartz wafer;

forming a mask on a surface of said wafer, wherein the perimeter of said mask has a first segment and a second segment thereon, said first and second segments sharing a common end point, and wherein the angle between said first and second segments is an obtuse angle; and etching said wafer with said mask formed thereon.

* * * * *